(12) United States Patent
Tak et al.

(10) Patent No.: US 7,851,859 B2
(45) Date of Patent: *Dec. 14, 2010

(54) SINGLE TRANSISTOR MEMORY DEVICE HAVING SOURCE AND DRAIN INSULATING REGIONS AND METHOD OF FABRICATING THE SAME

(75) Inventors: Nam-Kyun Tak, Bucheon-si (KR); Ki-Whan Song, Seoul (KR); Chang-Woo Oh, Suwon-si (KR); Woo-Yeong Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 143 days.

This patent is subject to a terminal disclaimer.

(21) Appl. No.: 11/829,113

(22) Filed: Jul. 27, 2007

(65) Prior Publication Data

US 2008/0099811 A1    May 1, 2008

(30) Foreign Application Priority Data

Nov. 1, 2006   (KR) ............... 10-2006-0107345
Nov. 29, 2006  (KR) ............... 10-2006-0119087

(51) Int. Cl.
*H01L 23/62* (2006.01)
(52) U.S. Cl. .................. 257/347; 257/E27.085
(58) Field of Classification Search ............ 257/296, 257/330, 347, E27.085
See application file for complete search history.

(56) References Cited

U.S. PATENT DOCUMENTS 5,674,760 A   10/1997  Hong
6,188,105 B1   2/2001  Kocon et al.
6,495,887 B1  12/2002  Krishnan et al.
7,061,050 B2 * 6/2006  Fazan et al. ............. 257/348
7,122,431 B2 * 10/2006 Kim et al. ................ 438/259

(Continued)

FOREIGN PATENT DOCUMENTS

EP    1739749 A2    1/2007

(Continued)

OTHER PUBLICATIONS

R. Ranica et al., "Scaled 1T-Bulk devices built with CMOS 90nm technology for low-cost eDRAM applications," 2005 Symposium on VLSI Technology Digest of Technical Papers, pp. 38 and 39.

(Continued)

*Primary Examiner*—Minh-Loan T Tran
*Assistant Examiner*—Vongsavanh Sengdara
(74) *Attorney, Agent, or Firm*—Volentine & Whitt, P.L.L.C.

(57) ABSTRACT

A single transistor floating-body dynamic random access memory (DRAM) device includes a floating body located on a semiconductor substrate and a gate electrode located on the floating body, the floating body including an excess carrier storage region. The DRAM device further includes source and drain regions respectively located at both sides of the gate electrode, and leakage shielding patterns located between the floating body and the source and drain regions. Each of the source and drain regions contact the floating body, which may be positioned between the source and drain regions. The floating body may also laterally extend under the leakage shielding patterns, which may be arranged at outer sides of the gate electrode.

16 Claims, 18 Drawing Sheets

U.S. PATENT DOCUMENTS

| | | |
|---|---|---|
| 2003/0168677 A1 | 9/2003 | Hsu |
| 2004/0061148 A1 | 4/2004 | Hsu |
| 2004/0266081 A1* | 12/2004 | Oh et al. .................... 438/197 |
| 2005/0128787 A1 | 6/2005 | Mouli |
| 2005/0205931 A1* | 9/2005 | Mouli ....................... 257/347 |
| 2006/0046408 A1 | 3/2006 | Ohsawa |
| 2006/0049444 A1 | 3/2006 | Shino |
| 2006/0177980 A1 | 8/2006 | Willer |
| 2007/0001165 A1 | 1/2007 | Ranica et al. |
| 2007/0278591 A1* | 12/2007 | Luo et al. ................... 257/374 |
| 2008/0099811 A1 | 5/2008 | Tak et al. |

FOREIGN PATENT DOCUMENTS

| | | |
|---|---|---|
| JP | 2005-175090 | 6/2005 |
| JP | 2005251791 | 9/2005 |
| JP | 2006-080280 | 3/2006 |
| JP | 2006080549 | 3/2006 |
| JP | 2005-158952 | 6/2006 |
| JP | 2006156540 | 6/2006 |
| KR | 10-1998-0015364 | 5/1998 |
| KR | 10-1999-0026126 | 4/1999 |
| KR | 100256254 B1 | 2/2000 |
| KR | 1020020002012 A | 1/2002 |
| KR | 1020040025070 | 3/2004 |
| KR | 10-2004-0077289 A | 9/2004 |
| KR | 10-2004-0086345 | 10/2004 |
| KR | 10-2005-0011376 | 1/2005 |
| KR | 1020050061883 A | 6/2005 |
| KR | 1020060070705 A | 6/2006 |
| KR | 1020060077157 A | 7/2006 |
| KR | 10-2006-0104794 | 10/2006 |

OTHER PUBLICATIONS

Office Action dated Jun. 10, 2009 from U.S. Appl. No. 11/853,044.

* cited by examiner

SINGLE TRANSISTOR MEMORY DEVICE HAVING SOURCE AND DRAIN INSULATING REGIONS AND METHOD OF FABRICATING THE SAME

CROSS-REFERENCE TO RELATED APPLICATIONS

A claim of priority is made to Korean Patent Application Nos. 10-2006-0107345 and 10-2006-0119087, filed on Nov. 1, 2006, and Nov. 29, 2006, respectively, the subject matters of which are hereby incorporated herein by reference.

BACKGROUND OF THE INVENTION

1. Field of the Invention

The present invention relates to a semiconductor device and a method of fabricating the same. More particularly, the present invention relates to a single transistor memory device having insulating regions associated with the source and drain regions, and a method of fabricating the same.

2. Description of the Related Art

A conventional dynamic random access memory (DRAM) cell, which is a type of volatile memory, typically incorporates a capacitor, a transistor and interconnection units. In response to demands for electronic devices to be increasingly lightweight, small and thin, DRAM cells have become more highly integrated. That is, as many DRAM cells as possible are formed within a restricted space However, the technology of highly integrating DRAM cells faces several limitations.

For example, a typical DRAM cell capacitor includes upper and lower electrodes, and a capacitor dielectric layer. The upper and lower electrodes share an overlapping region, and the capacitor dielectric layer is positioned between the upper and lower electrodes. The capacitance of the capacitor is directly proportional to the size of the overlapping region, and inversely proportional to a thickness of the overlapping region. A minimum area for forming a capacitor is therefore required.

A single transistor floating-body DRAM cell has been developed, which includes a floating body region for storing data. Because there is no capacitor, the single transistor floating-body DRAM cell may be more highly integrated than a common DRAM cell having a capacitor.

A capacitor-less, single transistor DRAM cell is described, for example, in an article entitled "Scaled IT-bulk Devices Built with CMOS 90 nm Technology for Low-cost eDRAM Applications" by R. RANICA (IEEE Symposium on VLSI Technology Digest of Technical Papers, pp. 38-39 (2005)). FIG. 1 herein is a cross-sectional view of a single transistor DRAM cell like that disclosed in the RANICA article.

Referring to FIG. 1, a semiconductor substrate 1 includes a deep n-well 3 and a pocket p-well 5 located in the deep n-well 3. An isolation layer 7 is located within a predetermined region of the pocket p-well 5, defining an active layer 5a of the pocket p-well 5. The isolation layer 7 is in contact with the deep n-well 3 through the pocket p-well 5. As a result, the active region 5a functions as an electrically floated bulk region, which is surrounded by the isolation layer 7 and the deep n-well 3.

Source and drain regions 16s and 16d are respectively located in both ends of the bulk region 5a, and a gate pattern 10 is located on the bulk region 5a between the source and drain regions 16s and 16d. The gate pattern 10 includes a gate insulating layer 8 and a gate electrode 9, which are sequentially stacked. A spacer 13 may be located on a sidewall of the gate pattern 10. The source region 16s may include a heavily-doped source region 15s spaced apart from the gate pattern 10, and a lightly-doped source region 11s extending from the heavily-doped source region 15s. Likewise, the drain region 16d may include a heavily-doped drain region 15d spaced apart from the gate pattern 10, and a lightly-doped drain region 11d extending from the heavily-doped drain region 15d. The lightly-doped source and drain regions 11s and 11d may be located beneath the spacer 13.

According to RANICA, the source and drain regions 16s and 16d are shallower in thickness than the active region 5a, i.e., the bulk region, as illustrated in FIG. 1. Thus, the bulk region 5a may also extend under the source and drain regions 16s and 16d. As a result, during a program operation, the number of holes stored in the bulk region 5a is maximized. However, the holes stored in the bulk region 5a may be recombined with electrons in the source and drain regions 16s and 16d after program operation, and erased in a short period of time. In other words, the single transistor DRAM cell illustrated in FIG. 1 has poor data retention characteristics.

Furthermore, when the source and drain regions 16s and 16d have large junction areas, junction capacitances Cs and Cd of the source and drain regions 16s and 16d also increase. Thus, a loading capacitance of a bit line electrically connected to the drain region 16d increases, which may lead to a decrease in a data sensing margin and operating speed of the single transistor DRAM cell.

Another example of a single transistor floating-body DRAM device is disclosed in U.S. Patent Application Publication No. 2006/0049444, entitled "Semiconductor Device and Method of Fabricating the Same" by SHINO. According to SHINO, a floating body having a single crystal structure is located on a semiconductor substrate. The floating body has an expanded structure capable of storing excess holes, although the excess holes may be easily erased through source and drain regions.

SUMMARY OF THE INVENTION

An aspect of the present invention provides a single transistor floating-body dynamic random access memory (DRAM) device, including a floating body located on a semiconductor substrate, the floating body having an excess carrier storage region, and a gate electrode located on the floating body. Source and drain regions are respectively located at both sides of the gate electrode, each of the source and drain regions contacting the floating body. Leakage shielding patterns are located between the floating body and the source and drain regions. The leakage shielding patterns may arranged at outer sides of the gate electrode, and may contact bottom surfaces of the source and drain regions. The leakage shielding patterns may include at least one of a silicon oxide layer, a silicon nitride layer and a silicon oxynitride layer.

The floating body may be positioned between the source and drain regions, and may laterally extend under the leakage shielding patterns. The floating body may include a single crystal semiconductor layer having p-type impurity ions. A width of the excess carrier storage region of the floating body may be larger than a width of the gate electrode.

The DRAM device may further include a buried insulating layer located between the semiconductor substrate and the floating body, and an isolation layer defining the floating body, where the leakage shielding patterns contact the isolation layer. Also, the semiconductor substrate may be configured to serve as a back gate electrode.

Another aspect of the present invention provides a method of fabricating a single transistor floating-body DRAM device, including defining a floating body in a semiconductor substrate, forming a gate pattern on the floating body, and forming leakage shielding patterns in the floating body at both sides of the gate pattern. The floating body includes an excess carrier storage region, which may extend beneath the leakage shielding patterns and between the source and drain regions. Forming the leakage shielding patterns may include injecting oxygen ions into the floatin body using the gate pattern as a mask to form temporary patterns, and annealing the temporary patterns Forming the leakage shielding patterns may also include injecting germanium (Ge) ions into the floating body using the gate pattern as a mask to form temporary patterns, etching the temporary patterns to form gaps, and filling the gaps with an insulating layer.

The method of fabricating the DRAM device may further include forming source and drain regions in the floating body above the gaps, and forming source and drain regions in contact with the leakage shielding patterns. Also, a gate dielectric layer may be formed on the floating body prior to forming the gate pattern. Forming the gate pattern may include sequentially stacking a gate electrode, a pad oxide layer and a mask nitride layer. Also, defining the floating body in the semiconductor substrate may include forming an isolation layer.

Another aspect of the present invention provides a single transistor memory cell, including an active semiconductor pattern having a bulk region and an impurity region, stacked in sequence on a semiconductor substrate, and insulated from the semiconductor substrate. The memory cell also includes a recessed region passing through the impurity region, dividing the impurity region into a source region and a drain region, which are separated from each other, where the recessed region includes first and second sidewalls adjacent to the source and drain regions, respectively. A first insulating region is positioned between the source region and the bulk region, and separated from the first sidewall of the recessed region, and a second insulating region is positioned between the drain region and the bulk region, and separated from the second sidewall of the recessed region. Each of the first insulating region and the second insulating region may include one of an empty space or an insulating layer pattern. A gate electrode is positioned within the recessed region.

A conductivity type of the impurity region may be different than a conductivity type of the bulk region. The bulk region may include a lower bulk region and an upper bulk region, the lower bulk region having a higher impurity concentration than the upper bulk region. In addition, the bulk region may include a first bulk region extending between the first insulating region and the first sidewall, and a second bulk region extending between the second insulating region and the second sidewall. Also, the gate electrode may include a projecting portion that extends above an upper surface of the impurity region, and a spacer may cover sidewalls of the projecting portion of the gate electrode. The first and second bulk regions may be aligned with the spacer. A gate insulating layer may be positioned between the gate electrode and the first and second sidewalls of the recessed region. Also, an insulating layer may cover the semiconductor substrate, the source and drain regions and the gate electrode. The memory cell may further include a back gate interconnection located on the insulating layer, and electrically connected to the semiconductor substrate through a back gate contact hole passing through the insulating layer.

Yet another aspect of the present invention provides a method of fabricating a single transistor memory cell, including forming an active semiconductor pattern surrounded by an isolation layer on a semiconductor substrate, the active semiconductor pattern including a bulk region and an impurity region, which are sequentially stacked. The method further includes forming a gate pattern passing through the impurity region to divide the impurity region into a source region and a drain region, which are separated from each other, and forming spacers on sidewalls of the gate pattern. Sacrificial impurity ions are injected into the bulk region, using the gate pattern and the spacers as ion injection masks, to form first and second sacrificial impurity layers under the source and drain regions, respectively. The sacrificial impurity ions may be silicon germanium ions. The isolation layer is etched to expose the first and second sacrificial impurity layers, and the first and second sacrificial impurity layers are removed to form first and second undercut regions, exposing bottom surfaces of the source and drain regions, respectively. An insulating layer is formed on the semiconductor substrate having the first and second undercut regions.

Forming the active semiconductor pattern may include preparing a silicon on insulator (SOI) substrate comprising a supporting substrate, a buried insulating layer and a semiconductor body layer, which are sequentially stacked; forming an isolation layer in contact with the buried insulating layer in a predetermined region of the semiconductor body layer to define an isolated semiconductor body pattern; and forming the impurity region in an upper portion of the semiconductor body pattern to define the bulk region under the impurity region. Also, forming the active semiconductor pattern may include preparing an SOI substrate having a supporting substrate, a buried insulating layer and a semiconductor body layer, which are sequentially stacked; forming the impurity layer in an upper portion of the semiconductor body layer to define the bulk layer under the impurity layer; and forming an isolation layer contacting the buried insulating layer in predetermined portions of the impurity layer and the bulk layer to define an isolated semiconductor body pattern comprising the bulk region and the impurity region.

Forming the gate pattern may include forming a mask pattern covering the impurity region and the isolation layer, the mask pattern defining an opening over the impurity region; forming a recessed region by etching the impurity region and the bulk region using the mask pattern as an etch mask, the recessed region dividing the impurity region into the source and drain regions; forming a gate insulating layer covering a bottom surface and sidewalls of the recessed region; forming a gate electrode and a capping insulating layer pattern, which are sequentially stacked, on the gate insulating layer within the recessed region; and removing the mask pattern to expose the gate electrode and the capping insulating layer pattern.

The first and second sacrificial impurity layers may be formed to have bottom surfaces above the bulk region, and may define a first bulk region between the first sacrificial impurity layer and the recessed region and a second bulk region between the second sacrificial impurity layer and the recessed region. The insulating layer may be formed to leave empty spaces in the first and second undercut regions, or to fill the first and second undercut regions. The method may further include patterning the insulating layer and forming a back gate contact hole to expose the semiconductor substrate, and forming a back gate interconnection electrically connected to the semiconductor substrate through the back gate contact hole.

BRIEF DESCRIPTION OF THE DRAWINGS

The embodiments of the present invention will be described with reference to the attached drawings, not necessarily drawn to scale, in which.

DETAILED DESCRIPTION OF THE EMBODIMENTS

Figure 1:
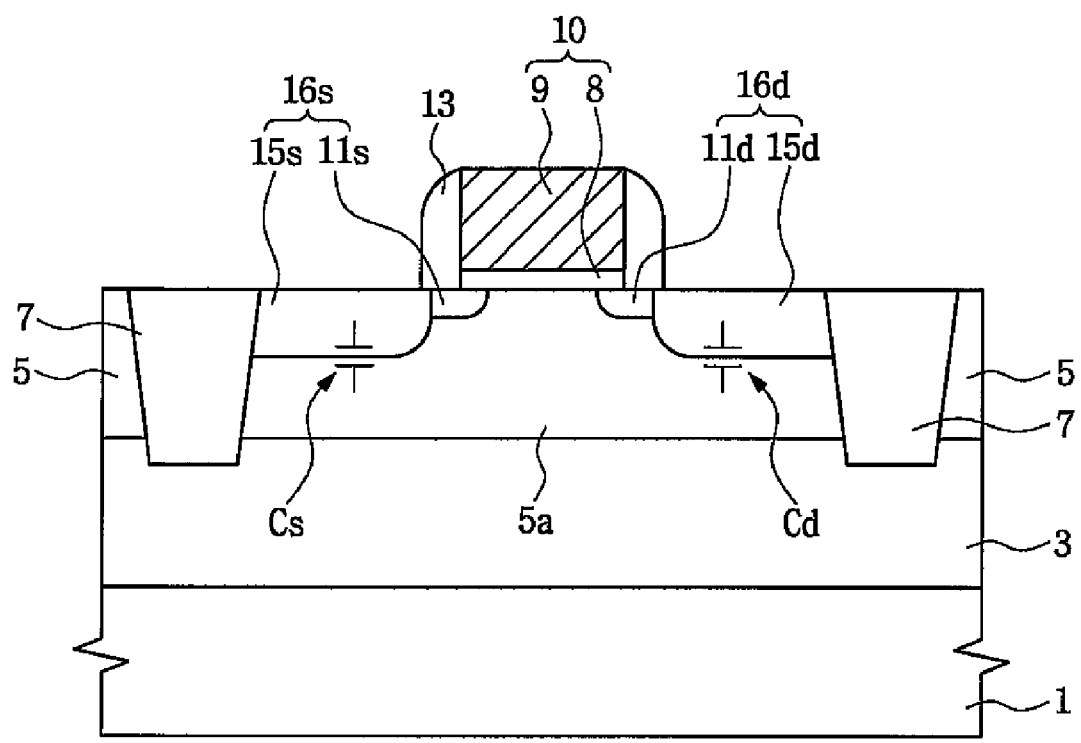
FIG. 1 is a cross-sectional view of a conventional single transistor memory cell.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are located as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

In the drawings, the thickness of layers and regions may be exaggerated for clarity. Also, when a layer is described to be formed on other layer or on a substrate, this means that the layer may be formed on the other layer or on the substrate, or a third layer may be positioned between the layer and the other layer or the substrate.

Figure 2:
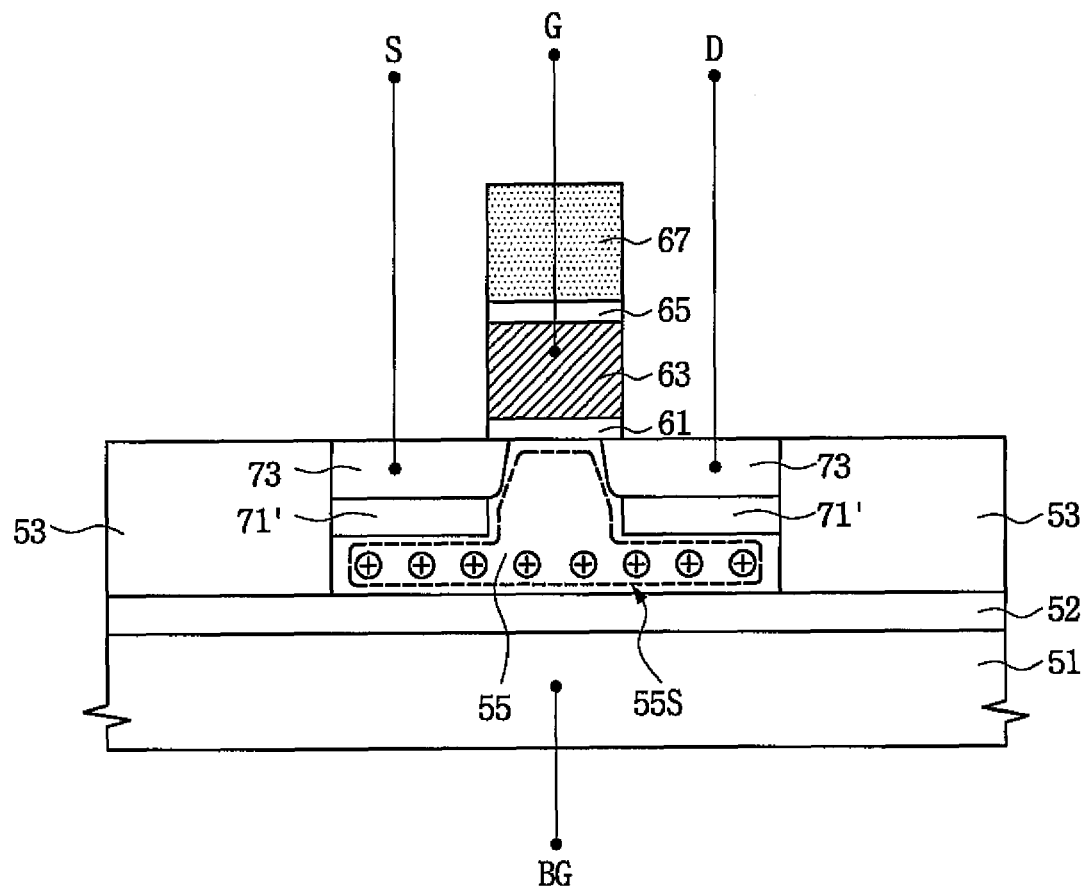
FIG. 2 is a cross-sectional view of a single transistor floating-body DRAM device, according to a first exemplary embodiment of the present invention.

FIG. 2 is a cross-sectional view of a single transistor floating-body dynamic random access memory (DRAM) device, according to a first exemplary embodiment of the present invention.

Referring to FIG. 2, a floating body 55 is on a semiconductor substrate 51. A gate electrode 63 may be located on the floating body 55, and source and drain regions 73 may be positioned at both sides of the gate electrode 63. The source and drain regions 73 may be in contact with the floating body 55. Leakage shielding patterns 71' may be located between the floating body 55 and the source and drain regions 73. An excess carrier storage region 55S may be included in the floating body 55.

The semiconductor substrate 51 may be a single crystal silicon wafer, for example, and the floating body 55 may be a semiconductor layer formed from single crystal silicon, for example. P- or n-type impurity ions may have been injected into the floating body 55. Also, the impurity ions may show a graded ion profile in the floating body 55. For example, the p-type impurity ions may gradually decrease in concentration toward a surface of the floating body 55.

Assuming that the floating body 55 has p-type impurity ions, the device will be described below. A buried insulating layer 52 may be positioned between the semiconductor substrate 51 and the floating body 55. In this case, the buried insulating layer 52 may cover the semiconductor substrate 51. The buried insulating layer 52 may be an insulating layer, such as a silicon oxide layer. The buried insulating layer 52 insulates the floating body 55 from the semiconductor substrate 51.

An isolation layer 53, defining the floating body 55, is positioned on the buried insulating layer 52, and may surround the floating body 55. The isolation layer 53 may be an insulating layer, such as a silicon oxide layer, a silicon nitride layer, a silicon oxynitride layer, or a combination thereof.

A gate dielectric layer 61 may be positioned between the floating body 55 and the gate electrode 63. The gate dielectric layer 61 may be a silicon oxide layer or a high-k dielectric layer, for example.

A mask nitride layer 67 may be located on the gate electrode 63. A pad oxide layer 65 may be positioned between the gate electrode 63 and the mask nitride layer 67. The gate electrode 63, the pad oxide layer 65 and the mask nitride layer 67, which are sequentially stacked, may constitute a gate pattern. The gate electrode 63 may be formed from a conductive layer, such as a polysilicon layer, a metal silicide layer, a metal layer, or a combination thereof. The mask nitride layer 67 may be a nitride layer, such as a silicon nitride layer. The pad oxide layer 65 may be a silicon oxide layer.

The source and drain regions 73 may include impurity ions with a different conductivity type from the floating body 55. For example, when the floating body 55 has the p-type impurity ions, the source and drain regions 73 may include n-type impurity ions. The source and drain regions 73 may be located at both sides of the gate electrode 63. Also, the source and drain regions 73 may be positioned to face each other over a space or distance, in 15 which case, at least a portion of the floating body 55 may be positioned between the source and drain regions 73 within the space.

The leakage shielding patterns 71' may be located under the source and drain regions 73. In this case, the floating body 55 may extend beneath the leakage shielding patterns 71'. The leakage shielding patterns 71' may be arranged at outer sides of the gate electrode 63. The leakage shielding patterns 71' may be insulating layers, such as silicon oxide layers.

As a result, the floating body 55 may be positioned between the source and drain regions 73 facing each other, and extend beneath the leakage shielding patterns 71'. Also, the floating body 55 may have a larger width than the gate electrode 63. The excess carrier storage region 55S may likewise have a larger width than the gate electrode 63.

One of the source and drain regions 73 is electrically connected to a source line S, and the other of the source and drain regions 73 is electrically connected to a drain line D. The gate electrode 63 is electrically connected to a gate line G. Also, the semiconductor substrate 51 may be electrically connected to a back gate line BG. In an embodiment, the source line S may be connected to a ground terminal, the drain line D may be a bit line, and the gate line G may be a word line.

Storing data, i.e., a write operation, in a floating body DRAM device according to the first exemplary embodiment of the present invention will now be explained. A gate program voltage higher than a threshold voltage (Vt) may be applied to the gate electrode 63, and a bit program voltage may be applied to the drain line D. The source line S may be grounded. The bit program voltage may be a positive voltage.

In this case, electron-hole pairs (EHP) are generated in the floating body 55 by impact ionization. The electrons generated by impact ionization may flow through the drain line D, whereas the holes generated by impact ionization may be accumulated in the excess carrier storage region 55S. That is, excess holes are accumulated in the excess carrier storage region 55S. The excess holes accumulated in the excess carrier storage region 55S change the threshold voltage (Vt).

However, a contact surface of the source and drain regions 73 and floating body 55 may be minimized by the leakage shielding patterns 71'. In other words, the leakage shielding patterns 71' may serve to block a leakage path of the excess holes. Accordingly, the leakage shielding patterns 71' may serve to extend the time during which the excess holes are retained in the excess carrier storage region 55S. As a result, according to the first exemplary embodiment of the present invention, the retention time of the excess holes accumulated in the excess carrier storage region 55S is significantly increased.

Furthermore, a back gate voltage may be applied to the back gate line BG, enabling the semiconductor substrate 51 to serve as a back gate, further extending the retention time of the excess holes.

The erase operation of the floating body DRAM device may be performed by applying a gate program voltage higher than the threshold voltage (Vt) to the gate electrode 63, and applying a bit erase voltage to the drain line D. The source line S may be grounded. The bit erase voltage may be a negative voltage. The excess holes accumulated in the excess carrier storage region 55S may be erased by the erase operation.

A read operation of the floating body DRAM device may be performed by applying a gate read voltage lower than the gate program voltage to the gate electrode 63, and applying a bit read voltage to the drain line D. The source line S may be grounded. An amount of current flowing between the source line S and the drain line D may be different depending on the existence or nonexistence of the excess holes. The data stored in the floating body DRAM device may be read out by sensing the amount of current flowing between the source line S and the drain line D.

Figure 3:
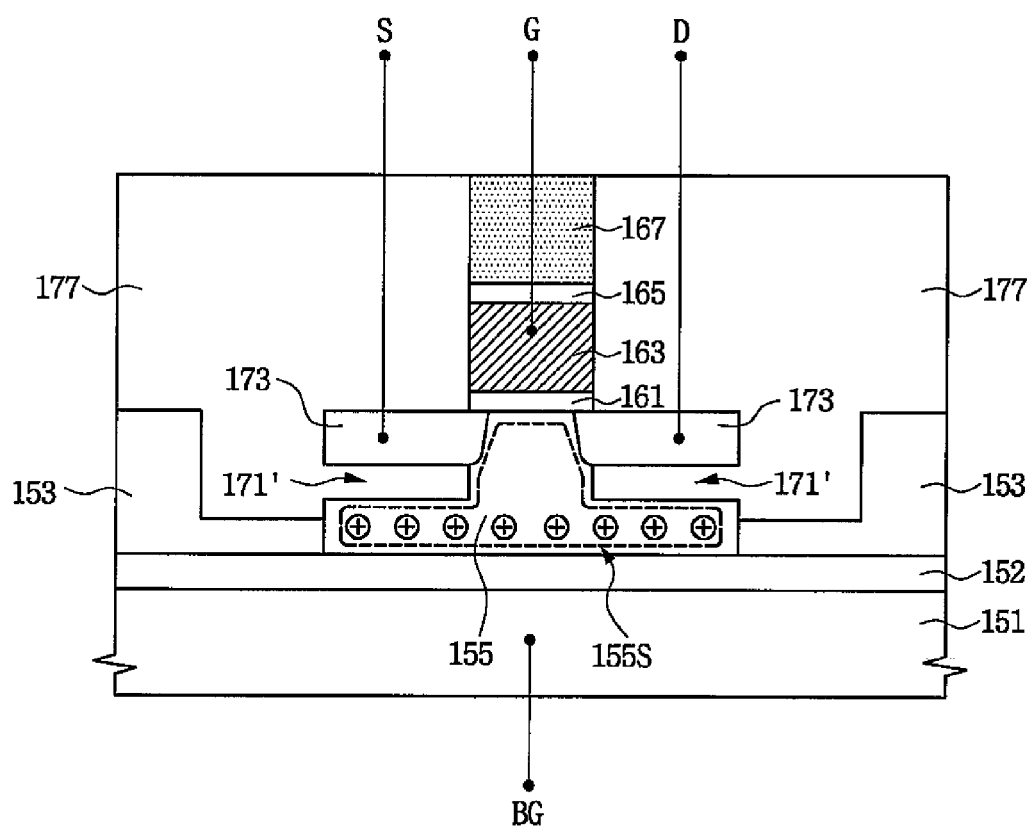
FIG. 3 is a cross-sectional view of a single transistor floating-body DRAM device, according to a second exemplary embodiment of the present invention.

FIG. 3 is a cross-sectional view of a single transistor floating-body DRAM device according to a second exemplary embodiment of the present invention.

Referring to FIG. 3, a floating body 155 is on a semiconductor substrate 151. A gate electrode 163 may be located on the floating body 155. Source and drain regions 173 may be located at both sides of the gate electrode 163. The source and drain regions 173 may be in contact with the floating body 155. Leakage shielding patterns 171' may be positioned between the floating body 155 and the source and drain regions 173. An excess carrier storage region 155S may be located in the floating body 155.

The semiconductor substrate 151 may be a single crystal silicon wafer, for example. The floating body 155 may be a semiconductor layer, for example, formed of single crystal silicon. P-type impurity ions may be injected into the floating body 155. The p-type impurity ions may decrease in concentration toward a surface of the floating body 155.

A buried insulating layer 152 may be positioned between the semiconductor substrate 151 and the floating body 155. An isolation layer 153 defining the floating body 155 may be on the buried insulating layer 152. A gate dielectric layer 161 may be positioned between the floating body 155 and the gate electrode 163. A pad oxide layer 165 and a mask nitride layer 167, which are sequentially stacked, may be located on the gate electrode 163.

The source and drain regions 173 may have impurity ions with a different conductivity type from the floating body 155. For example, when the floating body 155 has the p-type impurity ions, the source and drain regions 173 may include n-type impurity ions. The source and drain regions 173 may be located at both sides of the gate electrode 163, respectively. Also, the source and drain regions 173 may be positioned to face each other over a space or distance. In this case, at least a portion of the floating body 155 may be positioned between the source and drain regions 173 within the space.

An interlayer insulating layer 177 covering sidewalls of the source and drain regions 173 may be included above the semiconductor substrate 151. In an embodiment, top surfaces of the interlayer insulating layer 177 and the mask nitride layer 167 may be exposed on the same plane. The interlayer insulating layer 177 may be an insulating layer, such as a silicon oxide layer, a silicon nitride layer, a silicon oxynitride layer, or a combination thereof.

The interlayer insulating layer 177 may extend between the source and drain regions 173 and the floating body 155, and thus serve as the leakage shielding patterns 171', located under the source and drain regions 173. In the depicted embodiment, the floating body 155 may extend through the leakage shielding patterns 171'. The leakage shielding patterns 171' may be arranged on outer sides of the gate electrode 163. The leakage shielding patterns 171' may be formed of an insulating layer, such as a silicon oxide layer, a silicon nitride layer, a silicon oxynitride layer, or a combination thereof.

As a result, the floating body 155 may be positioned between the source and drain regions 173 facing each other and extending beneath the leakage shielding patterns 171'. The floating body 155 may be larger in width than the gate electrode 163. The excess carrier storage region 155S may likewise be larger in width than the gate electrode 163.

One of the source and drain regions 173 is electrically connected to a source line S, and the other of the source and drain regions 173 is electrically connected to a drain line D. The gate electrode 163 is electrically connected to a gate line G Also, the semiconductor substrate 151 may be electrically connected to a back gate line BG. In an embodiment, the source line S may be connected to a ground terminal, the drain line D may be a bit line, and the gate line G may be a word line.

A write operation in the floating body DRAM device according to the second exemplary embodiment of the present invention may include applying a gate program voltage higher than a threshold voltage (Vt) to the gate electrode 163, and applying a bit program voltage to the drain line D. The source line S may be grounded. The bit program voltage may be a positive voltage.

In this case, electron-hole pairs (EHPs) may be generated in the floating body 155 by impact ionization. The electrons generated by the impact ionization may flow through the drain line D, whereas the holes generated by the impact ionization may be accumulated in the excess carrier storage region 155S. That is, excess holes are accumulated in the excess carrier storage region 155S. The excess holes accumulated in the excess carrier storage region 155S change the threshold voltage (Vt).

However, a contact surface of the source and drain regions 173 and the floating body 155 may be minimized by the leakage shielding patterns 171'. In other words, the leakage shielding patterns 171' may serve to block a leakage path of the excess holes. Accordingly, the leakage shielding patterns 171' extend the time during which the excess holes are retained in the excess carrier storage region 155S. As a result, according to the second exemplary embodiment of the present invention, the retention time of the excess holes accumulated in the excess carrier storage region 155S is significantly increased.

Figure 4:
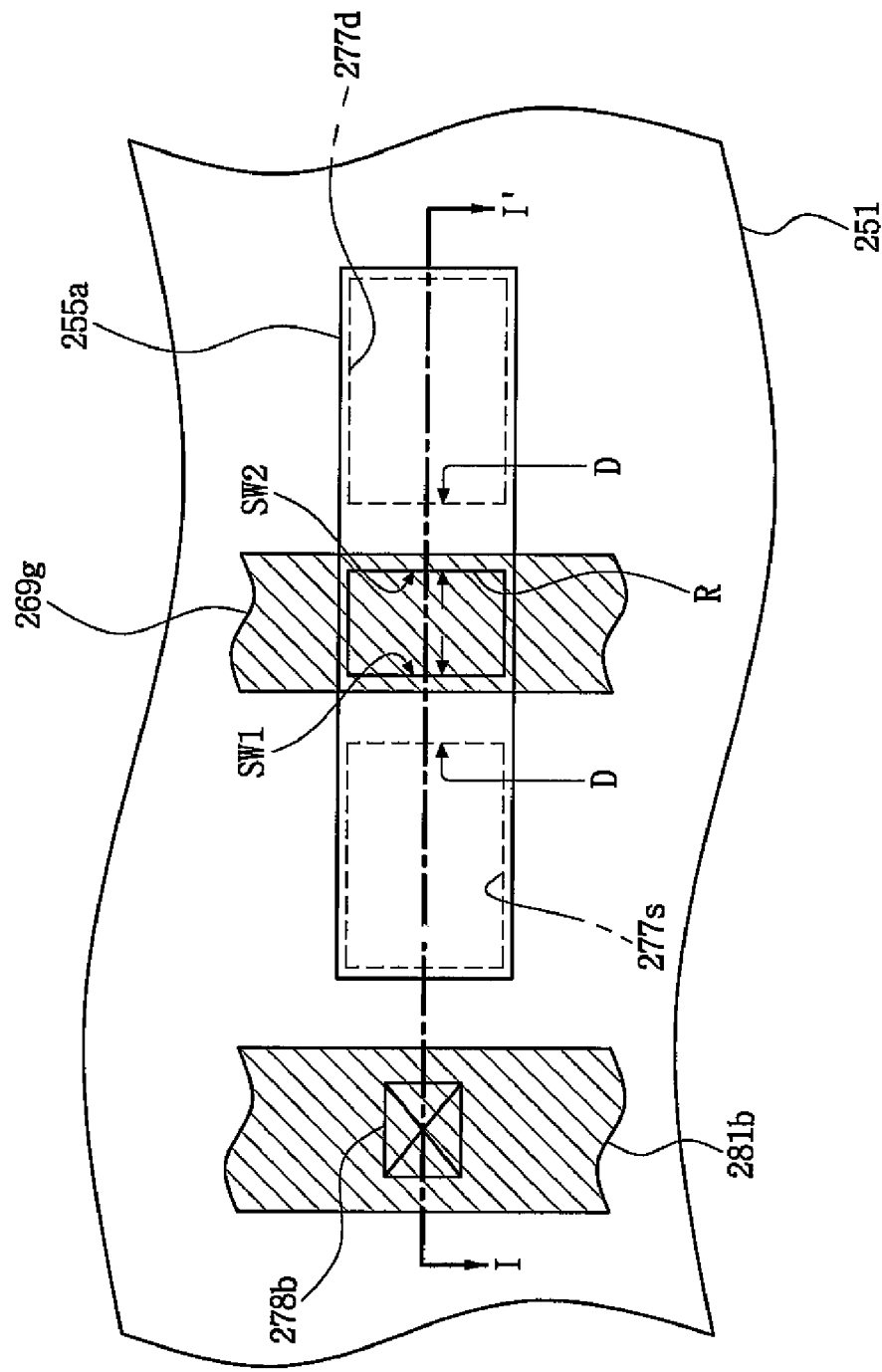
FIG. 4 is a plan view of a single transistor memory cell, according to a third exemplary embodiment of the present invention.
Figure 5:
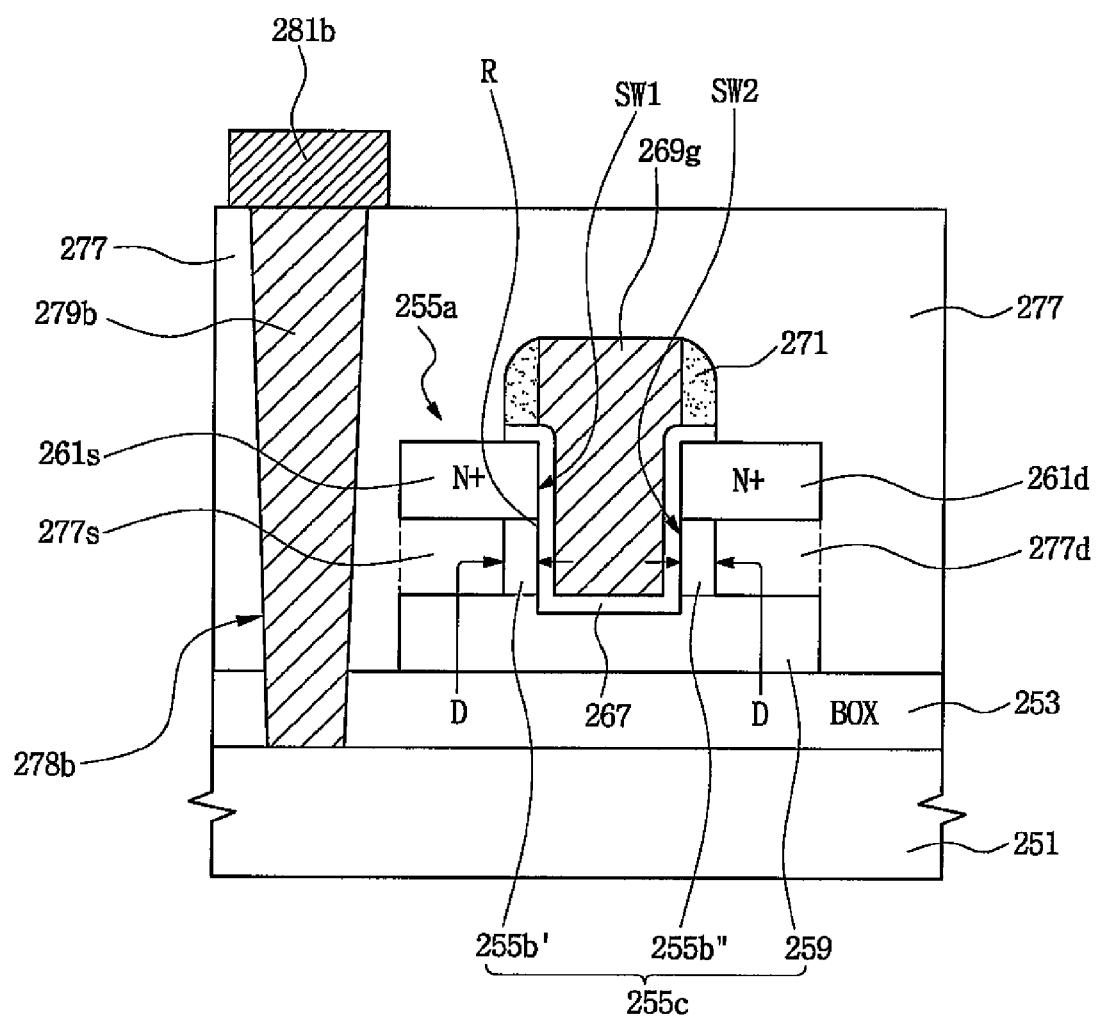
FIG. 5 is a cross-sectional view taken along line I-I' of FIG. 4.

FIG. 4 is a plan view of a single transistor memory cell according to a third exemplary embodiment of the present invention, and FIG. 5 is a cross-sectional view taken along line I-I' of FIG. 4.

Referring to FIGS. 4 and 5, a buried insulating layer 253 is stacked on a semiconductor substrate 251, and an active semiconductor pattern 255a is on a portion of the buried insulating layer 253. The semiconductor substrate 251 may be formed, for example, from a supporting substrate of a silicon on insulator (SOI) substrate. The active semiconductor pattern 255a may include a bulk region 255c and an impurity region (for providing a source region 261s and a drain region 261d, discussed below), which are sequentially stacked. The impurity region may have a different conductivity type from the bulk region 255c. For example, when the bulk region 255c is formed of p-type semiconductor, the impurity region may be formed of n-type semiconductor.

A recessed region R passes through the impurity region and extends into the bulk region 255c. The recessed region R divides the impurity region into a source region 261s and a drain region 261d, which are spaced apart from each other. In other words, a depth of the recessed region R may be greater than thicknesses of the impurity region, i.e., the source and drain regions 261s and 261d, and less than the total thickness of the active semiconductor pattern 255a. Also, the recessed region R includes first and second sidewalls SW1 and SW2, which are adjacent to the source and drain regions 261s and 261d, respectively.

The recessed region R may contain an insulated gate electrode 269g, which is insulated from the active semiconductor pattern 255a by a gate insulating layer 267. That is, the gate insulating layer 267 may be positioned between the insulated gate electrode 269g and inner walls of the first and second sidewalls SW1 and SW2 of the recessed region R. Furthermore, the insulated gate electrode 269g may extend upwardly beyond the top surfaces of the source and drain regions 261s and 261d. In this case, spacers 271 may be located on sidewalls of the projecting part of the insulated gate electrode 269g. The active semiconductor pattern 255a, the insulated gate electrode 269g, the spacers 271 and the buried insulating layer 253 may be covered with an insulating layer 277.

A first insulating region 277s of the insulating layer 277 may be located between the source region 261s and the bulk region 255c, and a second insulating region 277d may be located between the drain region 261d and the bulk region 255c. The first and second insulating regions 277s and 277d are in contact with bottom surfaces of the source and drain regions 261s and 261d, respectively. Also, the first and second insulating regions 277s and 277d may be spaced a specific distance D from the first and second sidewalls SW1 and SW2 of the recessed region R. Thus, a first bulk region 255b' is located between the first insulating region 277s and the first sidewall SW1, and a second bulk region 255b" is located between the second insulating region 277d and the second sidewall SW2. As a result, the first and second bulk regions 255b' and 255b" may have the same width as the specific distance D. When spacers 271 are included, the first and second bulk regions 255b' and 255b" may be self-aligned with the spacers 271 to have the same width as the spacers 271.

The first and second insulating regions 277s and 277d may be empty spaces or insulating layer patterns. The bulk region 255c includes the first and second bulk regions 255b' and 255b", as well as a base bulk region 259, which is located beneath the insulating regions 277s and 277d, the first and second bulk regions 255b' and 255b" and the recessed region R.

The bulk region 255c may include lower and upper bulk regions. The lower bulk region may have a higher impurity concentration than the upper bulk region. The first and second insulating regions 277s and 277d may have the same thickness as the upper bulk region. In this case, top surfaces of the insulating regions 277s and 277d may be in contact with bottom surfaces of the source and drain regions 261s and 261d, and bottom surfaces of the insulating regions 277s and 277d may be in contact with a top surface of the base bulk region 259. In other words, the lower bulk region may correspond to the base bulk region 259 of FIG. 5, and the upper bulk region may correspond to the first and second bulk regions 255b' and 255b" of FIG. 5. Alternatively, the first and second insulating regions 277s and 277d may be thinner or thicker than the upper bulk region. In any case, the top surfaces of the first and second insulating regions 277s and 277d are in contact with the bottom surfaces of the source and drain regions 261s and 261d.

A back gate interconnection 281b may be located on the insulating layer 277. The back gate interconnection 281b may be electrically connected to the semiconductor substrate 251 through a back gate contact plug 279b, for example, filling a back gate contact hole 278b passing through the insulating layer 277.

Figure 6:
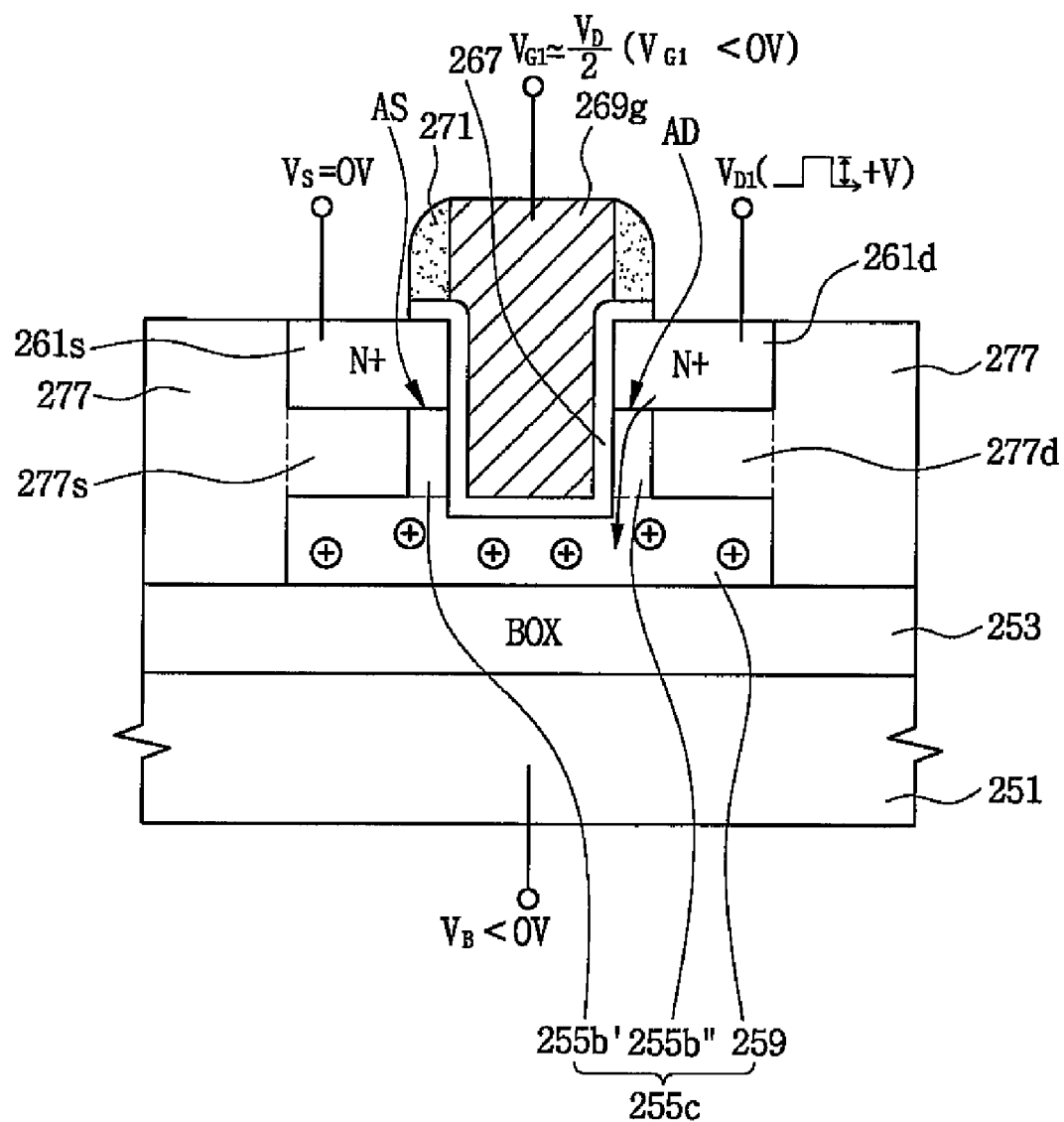
FIG. 6 is a cross-sectional view illustrating a method of programming a single transistor memory cell, according to the third exemplary embodiment of the present invention.

FIG. 6 is a cross-sectional view illustrating a program operation which stores data "1" in the single transistor memory cell illustrated with reference to FIGS. 4 and 5. The single transistor memory cell illustrated in FIGS. 4 and 5 is assumed to be an n-channel MOS transistor cell, merely for the convenience of describing the operation, and it is thus understood that different types of transistor cells may be incorporated into the depicted embodiment without departing for the spirit and scope of the present invention.

Referring to FIG. 6, the single transistor memory cell according to the third exemplary embodiment of the present invention may be programmed by several methods. For example, the single transistor memory cell shown in FIGS. 4 and 5 may be programmed by applying a source voltage $V_S$ of 0 volts to the source region 261s, and a first drain voltage $V_{D1}$ having a positive pulse waveform to the drain region 261d. During application of the first drain voltage $V_{D1}$, a first gate voltage $V_{G1}$ may be applied to the gate electrode 269g, and a back gate voltage $V_B$ having a negative voltage may be applied to the semiconductor substrate 251.

The first gate voltage $V_{G1}$ may be a voltage corresponding to half of the drain voltage $V_D$. In this case, impact ionization occurs at a junction between the drain region 261d and the second bulk region 255b", thereby generating a large number of holes and electrons. The holes are stored in the bulk region 255c to reduce a threshold voltage of the single transistor memory cell of FIG. 6.

In particular, when the back gate voltage $V_B$ is applied to the semiconductor substrate 251, most of the excess holes stored in the bulk region 265c are stored in the lower region of the bulk region 255c (i.e., the base bulk region 259) by an electric field caused by the back gate voltage $V_B$. Also, junction areas AS and AD of the source and drain regions 261s and 261d may be significantly less than the junction areas of the source and drain regions 16s and 16d, for example, of the conventional single transistor memory cell illustrated in FIG. 1, due to the presence of the first and second insulating regions 277s and 277d. Accordingly, even when the first drain voltage $V_{D1}$ is changed to 0 volts after the program operation, recombination paths between the excess holes in the bulk region 255c and the electrons in the source and drain regions 261s and 261d may be significantly reduced, thereby increasing a holding time, i.e., a data retention time of the excess holes in the bulk region 255c. As a result, retention characteristics of data "1" improve in accordance with the depicted embodiment.

In another embodiment, the first gate voltage $V_{G1}$ may be a negative voltage. In this case, holes may be induced into the second bulk region 255b" to cause band-to-band tunneling (BTBT) between the drain region 261d and the second bulk region 255b". During BTBT, a large amount of excess holes are stored in the bulk region 255c. Thus, the program operation may be performed.

Furthermore, when the bulk region 255c includes stacked, lower and upper bulk regions, as described above, the retention characteristics of data "1" are further improved. This is because most excess holes stored in the bulk region 255c may be stably stored in the lower bulk region having relatively larger volume and higher impurity concentration than the upper bulk region without application of the back gate voltage.

Figure 7:
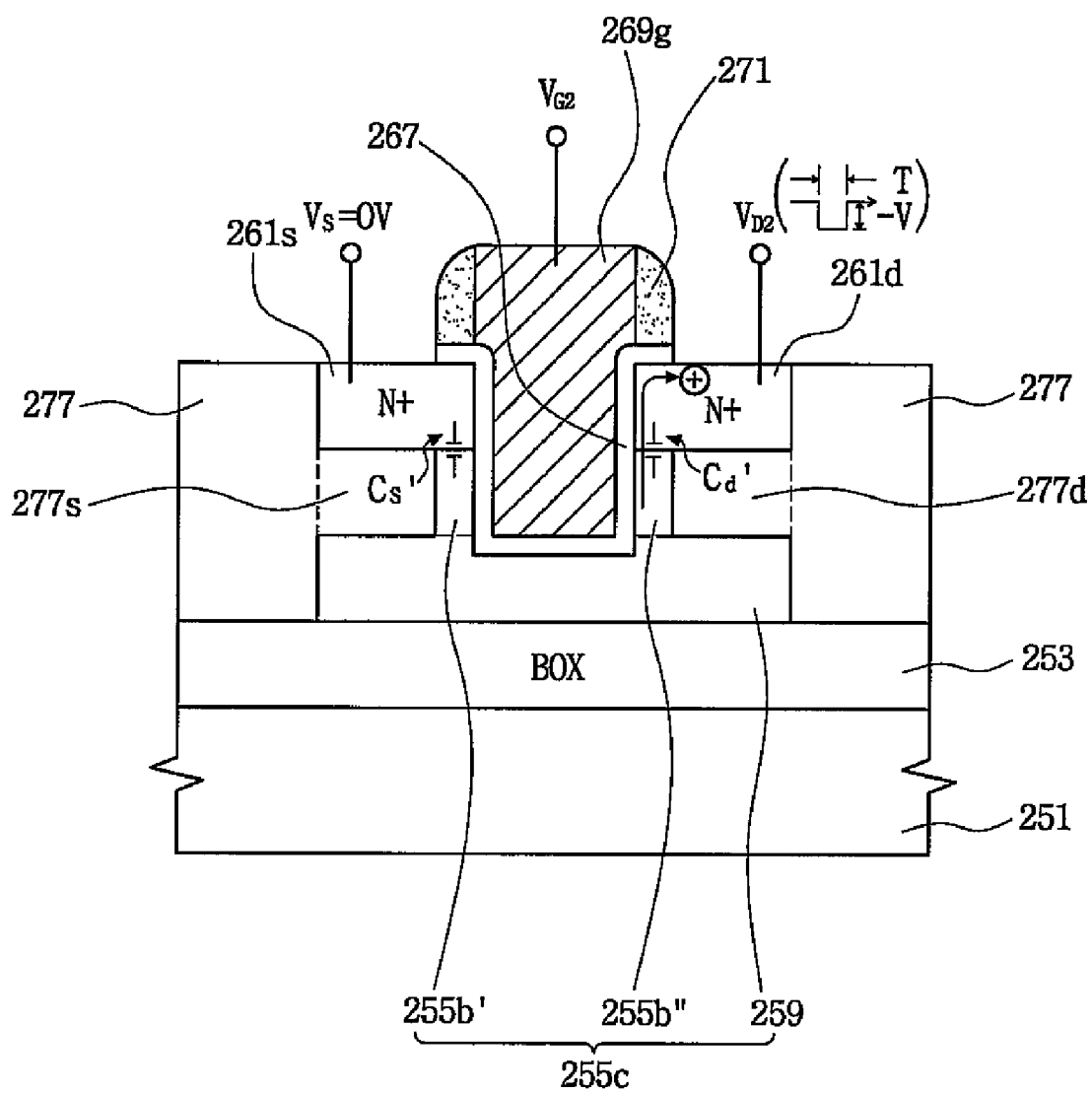
FIG. 7 is a cross-sectional view illustrating a method of erasing a single transistor memory cell, according to the third exemplary embodiment of the present invention.

FIG. 7 is a cross-sectional view illustrating an erase operation which stores data "0" in a single transistor memory cell according to a third exemplary embodiment of the present invention. Here, the single transistor memory cell is also assumed as an n-channel MOS transistor cell for convenience of the description.

Referring to FIG. 7, the single transistor memory cell according to the third exemplary embodiment of the present invention may be erased by applying a source voltage $V_S$ of 0 volts to the source region 261s, and a second drain voltage $V_{D2}$ having a negative pulse waveform to the drain region 261d. The second drain voltage $V_{D2}$ may have a negative voltage during an erasing is time T, and a voltage of 0 volts during an initial state before the erasing time T and during a holding state of data "0" after the erasing time T. Furthermore, a specific voltage, for example, a second gate voltage $V_{G2}$ of 0 volts, may be applied to the gate electrode 269g during the erase operation.

The holes in the bulk region 255c are injected into the drain region 261d during the erasing time T, to increase a threshold voltage of the single transistor memory cell of FIG. 7. Thus, the single transistor memory cell may have data corresponding to logic "0".

Subsequently, when the second drain voltage $V_{D2}$ is changed to 0 volts after the erasing time T, a surface potential of the bulk region 255c, i.e., a channel region, may be changed. In other words, when the channel region has a first surface potential during the erasing time T, the channel region may have a second surface potential different from the first surface potential after the erasing time T. In this case, a difference between the first and second surface s potentials may change depending on magnitudes of junction capacitances Cs' and Cd' in the source and drain regions 261s and 261d, respectively. Particularly, as the source and drain junction capacitances Cs' and Cd' decrease, the difference between the first and second surface potentials also decreases.

The source and drain junction capacitances Cs' and Cd' of the single MOS transistor according to the present invention are significantly smaller than the source and drain junction capacitances Cs and Cd of the conventional single transistor memory cell, for example, illustrated in FIG. 1, due to the presence of the first and second insulating regions 277s and 277d. Accordingly, after the conventional single transistor memory cell of FIG. 1 is erased, e.g., using the method described above with respect to FIG. 7, the channel region of the conventional single transistor memory cell may have a third surface potential higher than the second surface potential. It is therefore understood that the difference in threshold voltage before and after erasing the single transistor memory cell further increases, as the surface potential of the channel region after the erase operation decreases. As a result, the difference between the threshold voltage before and after erasing the single transistor memory cell according to the present embodiment may be higher than that of the conventional single transistor memory cell illustrated in FIG. 1. Thus, the single transistor memory cell of the present embodiment shows a larger sensing margin than the conventional single transistor memory cell illustrated in FIG. 1.

Furthermore, after the erase operation, a specific voltage, for example, 0 volts, may be continuously applied to the gate electrode 269g. In this case, the second bulk region 255b" may be fully or partially depleted. Accordingly, even when a positive voltage is applied to the drain regions 261d, the BTBT phenomenon between the second bulk region 255b" and the drain region 261d is effectively prevented.

When the BTBT occurs at a junction of the drain region 261d after the erase operation, excess holes are injected into the bulk region 255c, and thus the single transistor memory cell of FIG. 7 may be programmed again. However, according to the embodiment, the tunneling phenomenon of the erased single transistor memory cell is suppressed, as described above, thus improving the data retention characteristics of the erased single transistor memory cell. Particularly, when the width of the second bulk region 255b" is decreased, the second bulk region 255b" may be fully depleted. In this case, the BTBT at a junction of the drain region 261d may be further suppressed.

FIGS. 8 to 11 are cross-sectional views illustrating a method of fabricating a single transistor floating-body DRAM device, according to the first exemplary embodiment of the present invention.

Figure 8:
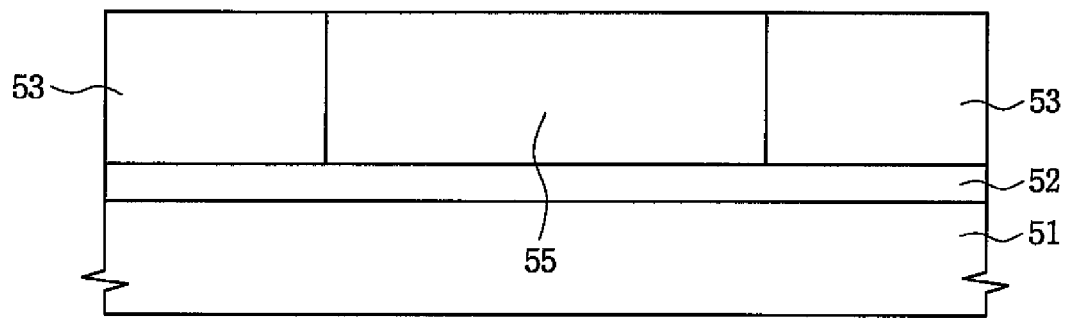
FIGS. 8 to 11 are cross-sectional views illustrating a method of fabricating a single transistor floating body DRAM device, according to the first exemplary embodiment of the present invention.

Referring to FIG. 8, a buried insulating layer 52 may be formed on a semiconductor substrate 51, to cover the semiconductor substrate 51. The buried insulating layer 52 may be formed from a silicon oxide layer, for example. A floating body 55 and an isolation layer 53 may be formed on the buried insulating layer 52.

The floating body 55 may be a semiconductor layer, for example, formed from single crystal silicon. P- or n-type impurity ions may be injected into the floating body 55. The impurity ions may show a graded ion profile in the floating body 55. For example, the p-type impurity ions may decrease in concentration toward a surface of the floating body 55.

Assuming that the floating body 55 has the p-type impurity ions, the fabrication method will be described below. The isolation layer 53 may be formed to surround the floating body 55. The isolation layer 53 may be an insulating layer, such as a silicon oxide layer, a silicon nitride layer, a silicon oxynitride layer, or a combination thereof. The isolation layer 53 may be formed by a well-known shallow trench isolation (STI) method. Alternatively, the floating body 55 and the isolation layer 53 may be formed using a silicon on insulator (SOI) wafer.

Figure 9:
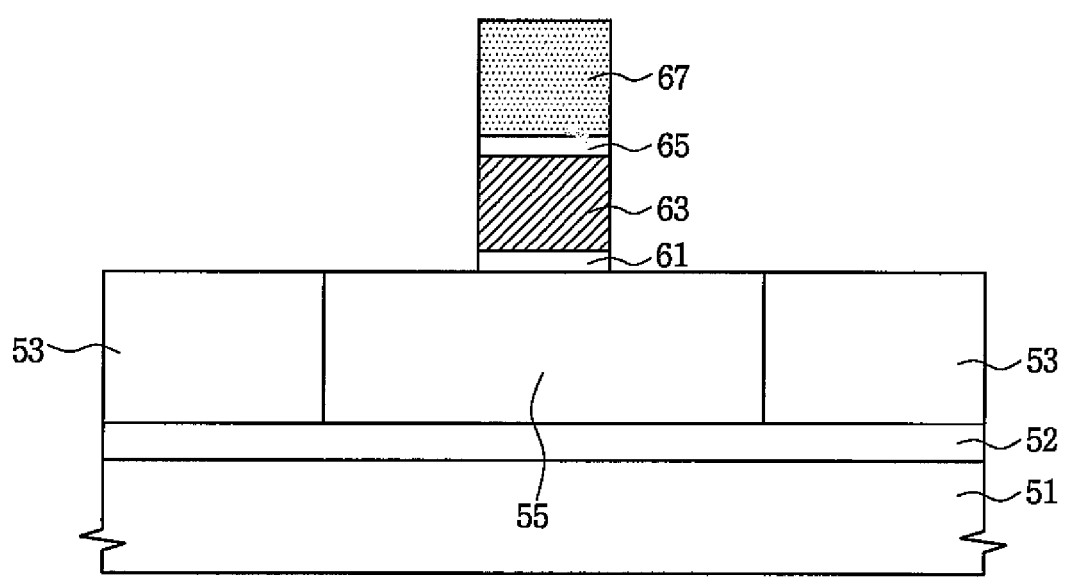

Referring to FIG. 9, a gate dielectric layer 61 may be formed to cover at least a portion of the floating body 55. The gate dielectric layer 61 may be a silicon oxide layer or a high-k dielectric layer, for example. In an embodiment, the gate dielectric layer 61 may be formed to cover both the floating body 55 and at least a portion of the isolation layer 53.

A gate pattern crossing the floating body 55 may be formed on the gate dielectric layer 61. The gate pattern may be formed from a gate electrode 63, a pad oxide layer 65, and a mask nitride layer 67, which are sequentially stacked on one another. The gate electrode 63 may be a conductive layer, formed from a polysilicon layer, a metal silicide layer, a metal later, or a combination thereof, for example. The mask nitride layer 67 may be a nitride layer, formed from a silicon nitride layer, for example. The pad oxide layer 65 may be a silicon oxide layer, for example. When the gate electrode 63 is formed from polysilicon, and the mask nitride layer 67 is formed from silicon nitride, the pad oxide layer 65 may serve to relieve stress caused by a difference in thermal expansion coefficients between the polysilicon layer and the silicon nitride layer.

Figure 10:
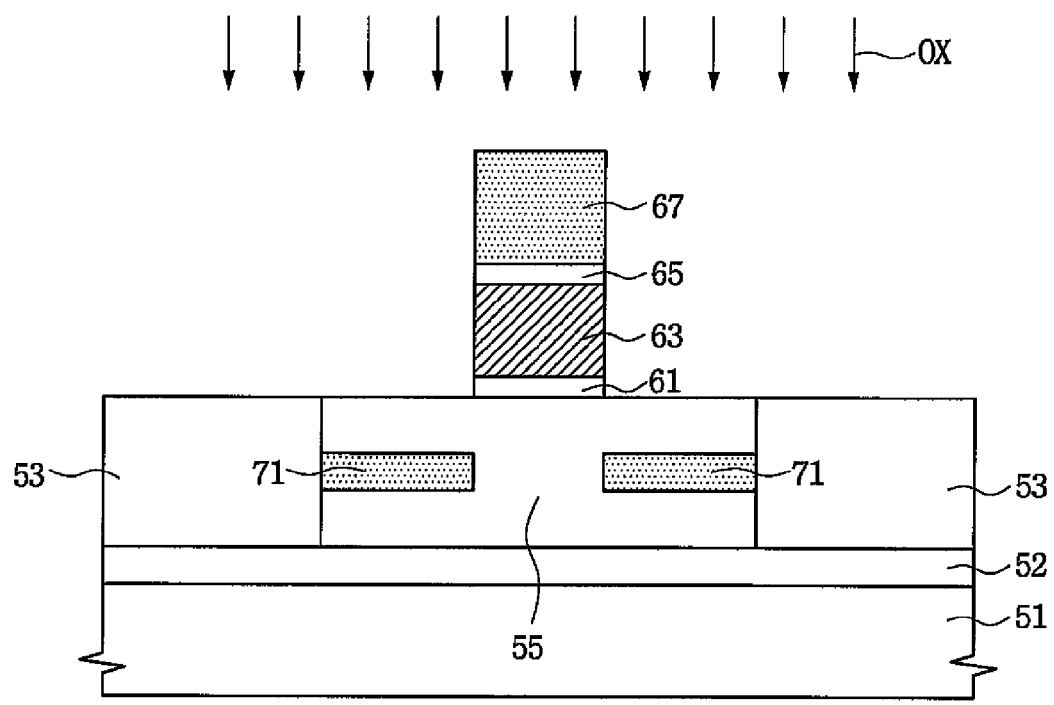

Referring to FIG. 10, oxygen ions OX may be injected into the floating body 55 using the gate pattern as an ion injection mask, thereby forming temporary patterns 71. The injection of the oxygen ions may be performed using various angles and energies.

The temporary patterns 71 may be formed at both sides of the gate pattern, and arranged at outer sides of the gate pattern. Furthermore, the temporary patterns 71 may be locally formed at a predetermined depth in the floating body 55. That is, the floating body 55 may be formed to remain beneath the temporary patterns 71. One surface of the temporary patterns 71 may be formed to be in contact with the isolation layer 53. The mask nitride layer 67 may serve to prevent the injection of the oxygen ions into the gate electrode 63.

Figure 11:
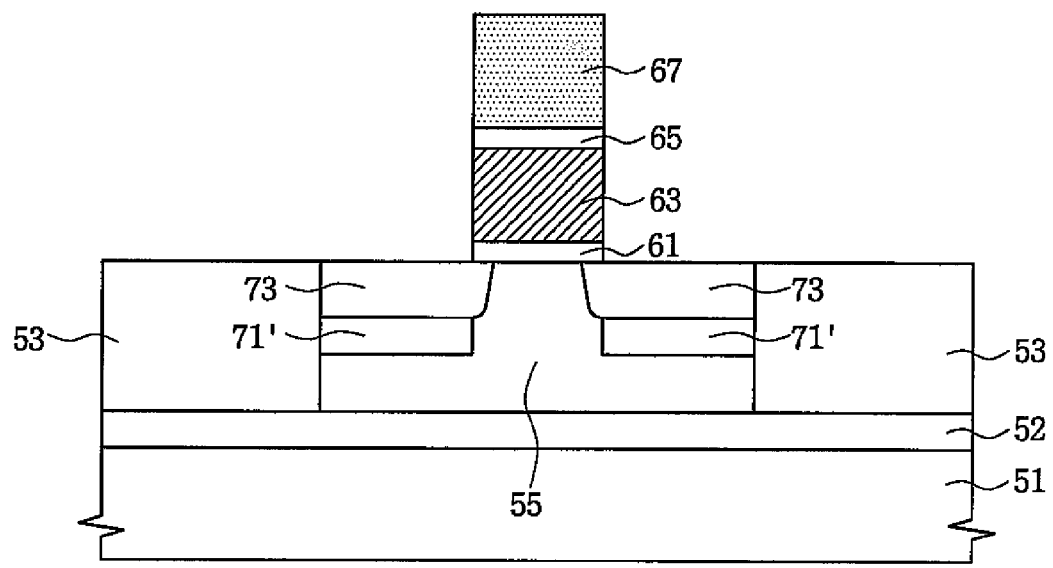

Referring to FIG. 11, the semiconductor substrate 51 having the temporary patterns 71 may be annealed to form leakage shielding patterns 71'. While annealing the semiconductor substrate 51, the oxygen ions in the temporary patterns 71 react with silicon, thus forming a silicon oxide layer. Thus, the leakage shielding patterns 71' may be formed from the silicon oxide layer. As a result, the leakage shielding patterns 71' are generally positioned the same as the temporary patters 71, e.g., arranged at outer sides of the gate pattern, and thus the gate electrode 63.

Impurity ions are injected into the floating body 55 using the gate pattern as an ion injection mask, thereby forming source and drain regions 73. When the floating body 55 has p-type impurity ions, the source and drain regions 73 may be formed by injecting n-type impurity ions.

The source and drain regions 73 may be formed at both sides of the gate electrode 63, respectively. Also, the source and drain regions 73 may be formed to face each other, over a distance or separation. In this case, at least a portion of the floating body 55 may remain in the space between the source and drain regions 73. The source and drain regions 73 and the floating body 55 may be in contact with each other.

The source and drain regions 73 may be formed on the leakage shielding patterns 71', and at least a portion of the floating body 55 may remain under the leakage shielding patterns 71'. As a result, the floating body 55 may be positioned between the source and drain regions 73, as well as beneath the leakage shielding patterns 71'. The floating body 55 may be formed to have a larger width than the gate electrode 63.

As described with reference to FIG. 2, an excess carrier storage region 55S may be formed in the floating body 55. The excess carrier storage region 55S may also have a larger width than the gate electrode 63.

A contact surface of the source and drain regions 73 and the floating body 55 may be minimized by the leakage shielding patterns 71'. That is, the leakage shielding patterns 71' serves to block a leakage path of the excess holes. Accordingly, the leakage shielding patterns 71' extends the time during which excess holes are retained in the excess carrier storage region 55S.

Subsequently, a single transistor floating-body DRAM device may be formed by known fabrication process of a semiconductor device such as formation of a bit line and a plug.

FIGS. 12 to 15 are cross-sectional views illustrating a method of fabricating a single transistor floating-body DRAM device, according to the second exemplary embodiment of the present invention.

Figure 12:
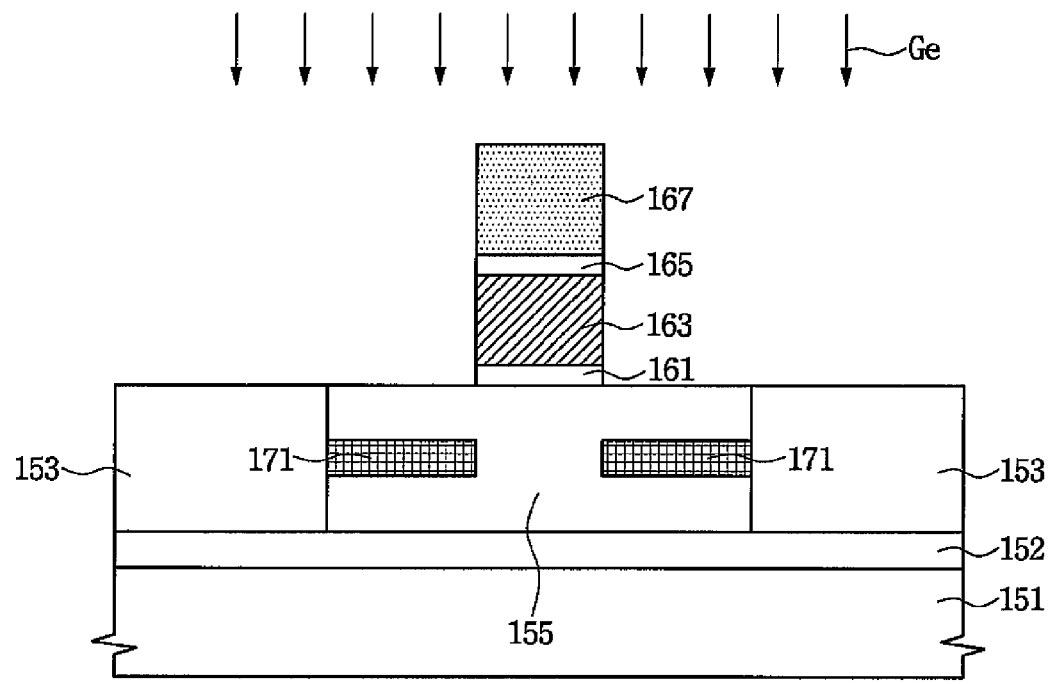
FIGS. 12 to 15 are cross-sectional views illustrating a method of fabricating a single transistor floating body DRAM device, according to the second exemplary embodiment of the present invention.

Referring to FIG. 12, a buried insulating layer 152, a floating body 155, and an isolation layer 153 may be formed on a semiconductor substrate 151 by the same method as described above with reference to FIG. 8. A gate dielectric layer 161 covering the floating body 155 may be formed. A gate pattern crossing the floating body 155 may be formed on the gate dielectric layer 161, as described above with reference to FIG. 9. The gate pattern may be formed from a gate electrode 163, a pad oxide layer 165, and a mask nitride layer 167, which are sequentially stacked.

Germanium (Ge) ions are injected into the floating body 155 using the gate pattern as an ion injection mask, thereby forming temporary patterns 171, as shown in FIG. 12. The injection of the Ge ions may be performed using various angles and energy. The temporary patterns 171 may be formed at both sides of the gate pattern, in which case, the temporary patterns 171 may be arranged at outer sides of the gate pattern. Furthermore, the temporary patterns 171 may be locally formed at a predetermined depth in the floating body 155, so that at least a portion of the floating body 155 may remain under the temporary patterns 171. One side of the temporary patterns 171 may be formed to be in contact with the isolation layer 153. The mask nitride layer 167 prevents the injection of the Ge ions into the gate electrode 163.

Figure 13:
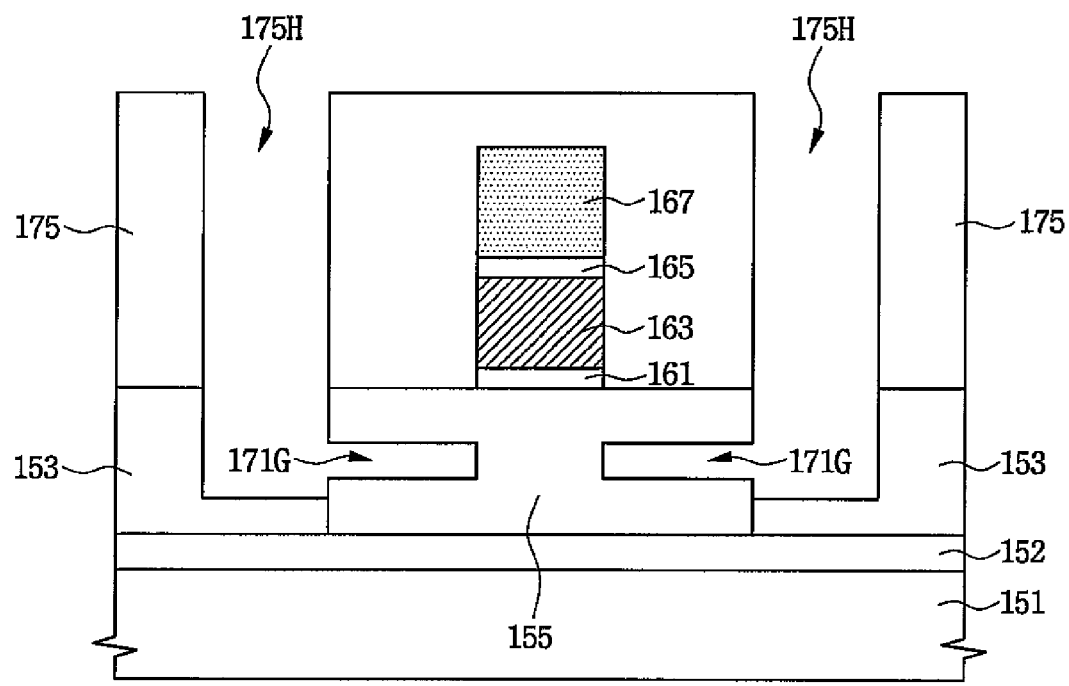

Referring to FIG. 13, a mask pattern 175 is formed on the semiconductor substrate 151. The mask pattern 175 may be formed to have an opening 175H exposing the isolation layer 153. The mask pattern 175 may be formed from a photoresist layer or a hard mask layer, for example.

The isolation layer 153 may be etched until the temporary patterns 171 are exposed using the mask pattern 175 as an etch mask. As a result, the floating body 155 and the temporary patterns 171 may be exposed in the opening 175H.

Gaps 171G may be formed by removing the temporary patterns 171. The gaps 171G may be formed by an isotropic etching process having an etch selectivity between the temporary patterns 171 and the floating body 155.

As described above, in the temporary patterns 171, the state that the Ge ions are injected into the single crystal silicon may be maintained. In this case, the single crystal silicon into which the de ions are injected may have an etch rate, for example, 100 times higher than the floating body 155. The mask pattern 175 may then be removed.

Figure 14:
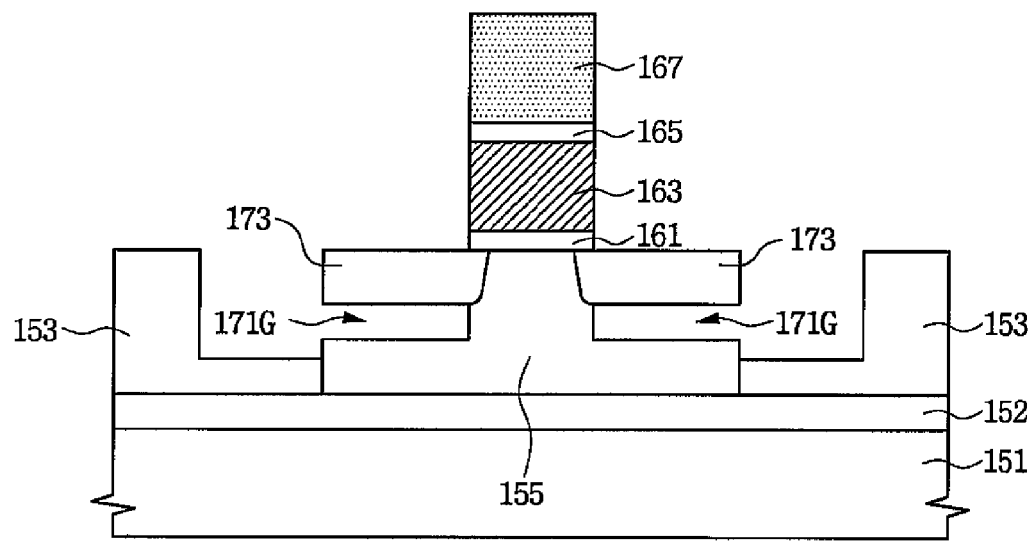

Referring to FIG. 14, impurity ions may be injected into the floating body 155 through the gaps 171G, using the gate pattern as an ion injection mask, thereby forming the source and drain regions 173. When the floating body 155 has p-type impurity ions, the source and drain regions 173 may be formed by injecting n-type impurity ions. The source and drain regions 173 may be formed at both sides of the gate electrode 163, respectively. Also, the source and drain regions 173 may be formed to face each other over a space or distance.

In this case, the floating body 155 may remain in the space between the source and drain regions 173, which face each other. As stated above, the floating body 155 may remain under the gaps 171G.

Figure 15:
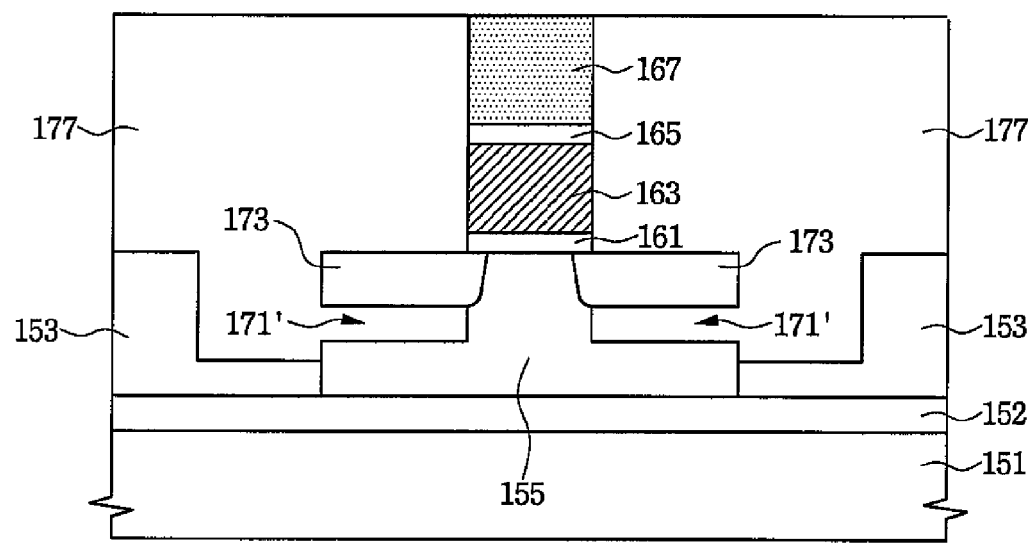

Referring to FIG. 15, an interlayer insulating layer 177 is formed to cover the semiconductor substrate 151, filling the gaps 171G. The interlayer insulating layer 177 may be formed, for example, from a silicon oxide layer, a silicon nitride layer, a silicon oxynitride layer, or a combination thereof. A top surface of the mask nitride layer 167 may be exposed by planarizing the interlayer insulating layer 177 In this case, top surfaces of the interlayer insulating layer 177 and the mask nitride layer 167 may be exposed on substantially the same plane.

The interlayer insulating layer 177 filling the gaps 171G serves as is leakage shielding patterns 171'. That is, the leakage shielding patterns 171' may be formed between the source and drain regions 173 and the floating body 155.

Subsequently, the single transistor floating-body DRAM device may be fabricated by known fabrication processes of the semiconductor device, such as the formation of a bit line and a plug.

As a result, the leakage shielding patterns 171' are formed beneath the source and drain regions 173. The floating body 155 may remain under the leakage shielding patterns 171'. The leakage shielding patterns 171' may be arranged at outer sides of the gate electrode 163. That is, the floating body 155 may be positioned between the source and drain regions 173 facing each other, and formed to extend beneath the leakage shielding patterns 171'. The floating body 155 may have a larger width than the gate electrode 163.

As described with reference to FIG. 3, an excess carrier storage region 155S may be formed in the floating body 155. The excess carrier storage region 155S may also be formed to have a larger width than the gate electrode 163.

A contact surface of the source and drain regions 173 and the floating body 155 may be minimized by the leakage shielding patterns 171'. In other words, the leakage shielding patterns 171' serve to block a leakage path of the excess holes. Accordingly, the leakage shielding patterns 171' extend the time for which the excess holes are retained in the excess carrier storage region 155S.

FIGS. 16 to 24 are cross-sectional views taken along line I-I' of FIG. 4 is illustrating the method of fabricating a single transistor memory cell, according to the third exemplary embodiment of the present invention.

Figure 16:
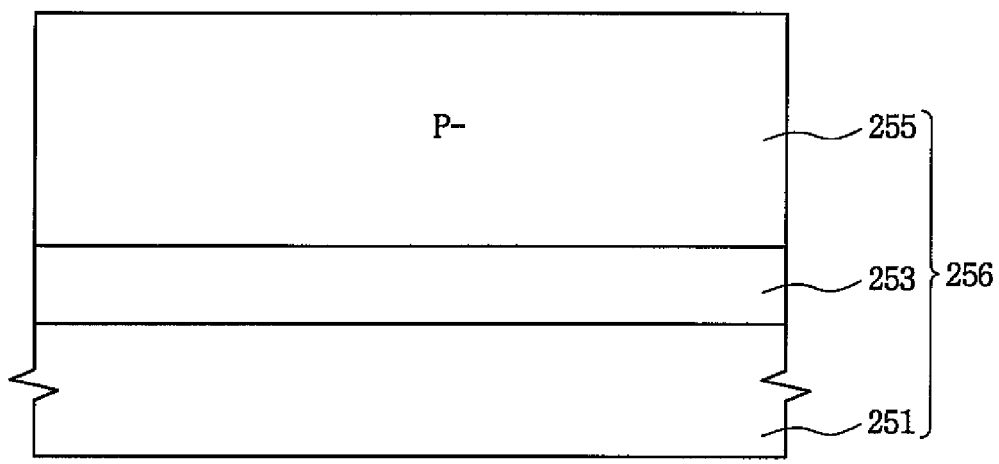
FIGS. 16 to 24 are cross-sectional views illustrating a method of fabricating a single transistor memory cell, according to the third exemplary embodiment of the present invention.

Referring to FIGS. 4 and 16, an SOI substrate 256 is prepared. The SOI substrate 256 may include a supporting substrate 251, a buried insulating layer 253 formed on the supporting substrate 251, and a semiconductor body layer 255 formed on the buried insulating layer 253. The supporting substrate 251 may be a semiconductor substrate, and the semiconductor body layer 255 may be a silicon layer, for example.

Figure 17:
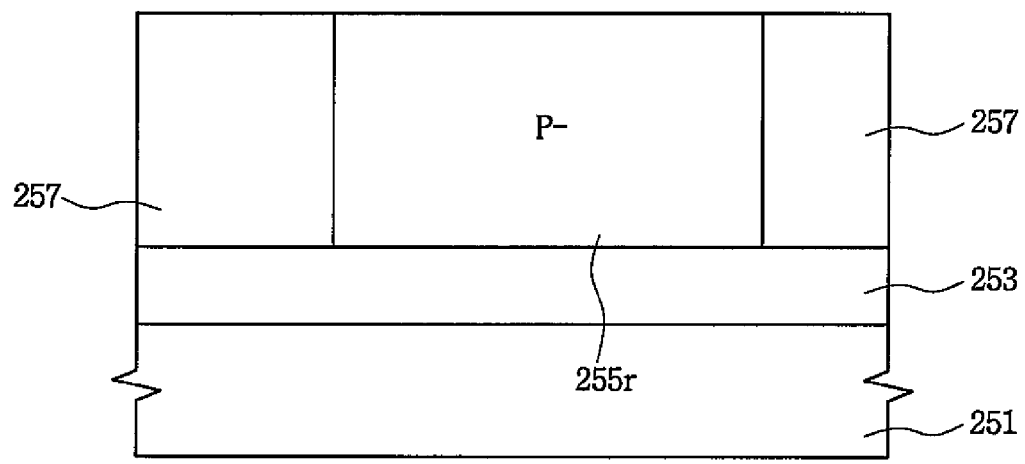

Referring to FIGS. 4 and 17, an isolation layer 257 is formed in a predetermined region of the semiconductor body layer 255, to form an active region 255r. The isolation layer 257 may be formed to be in contact with the buried insulating layer 253. As a result, the active region 255r may be electrically insulated from the supporting substrate 251 by the isolation layer 257 and the buried insulating layer 253.

Figure 18:
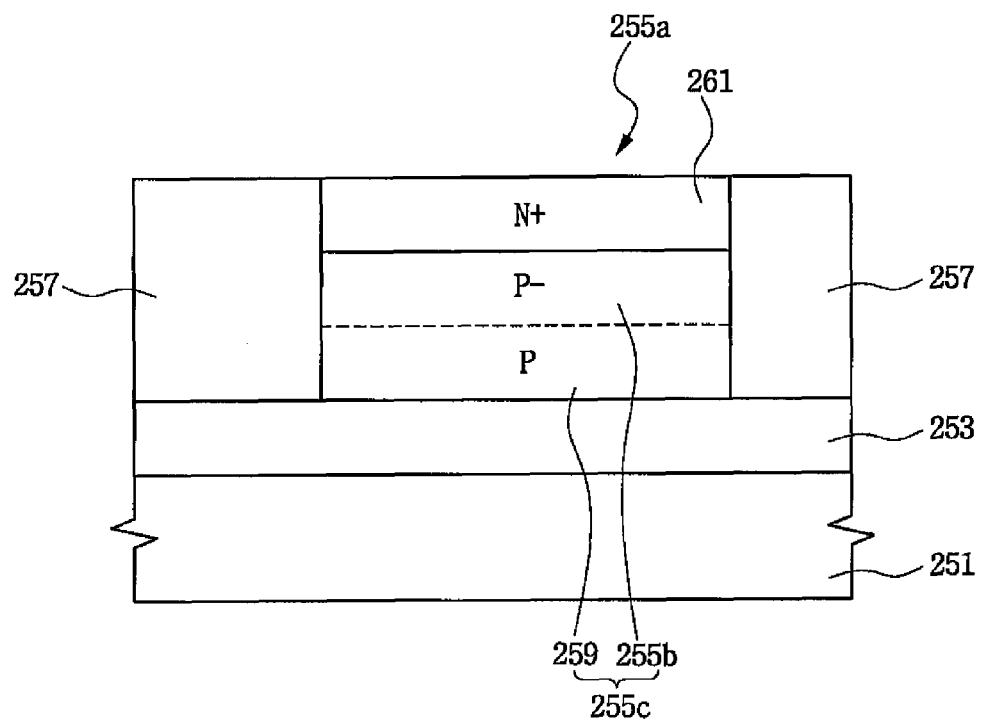

Referring to FIGS. 4 and 18, first impurity ions are injected into a surface of the active region 255r to form an impurity region 261. The impurity region 261 may be formed to have a different conductivity type from the active region 255r. For example, when the active region 255r is a p-type, the impurity region 261 may be an n-type. Second impurity ions are injected into a lower portion of the active region 255r to form a bulk region 255c, which includes a lower bulk region 259 and an upper bulk region 255b (between the lower bulk region 259 and the impurity region 261) defined by the lower bulk region 259. The lower bulk region 259 may be formed to have the same conductivity type as the active region 255r. In this case, the lower bulk region 259 may have a higher impurity concentration than the upper bulk region 255b. The bulk region 255c and the impurity region 261 constitute an active semiconductor pattern 255a.

Alternatively, the active semiconductor pattern 255a may be formed by a different method from that described above. For example, the process of forming the lower bulk region 259 may be omitted. Also, before forming the isolation layer 257, an impurity layer and a lower bulk layer may be respectively formed on an upper surface and in a lower region of the semiconductor body layer 255 to define an upper bulk layer between the impurity layer and the lower bulk layer. Then, the isolation layer 257 may be formed in the impurity layer, the upper bulk layer and the lower bulk layer to define the active semiconductor pattern 255a.

Figure 19:
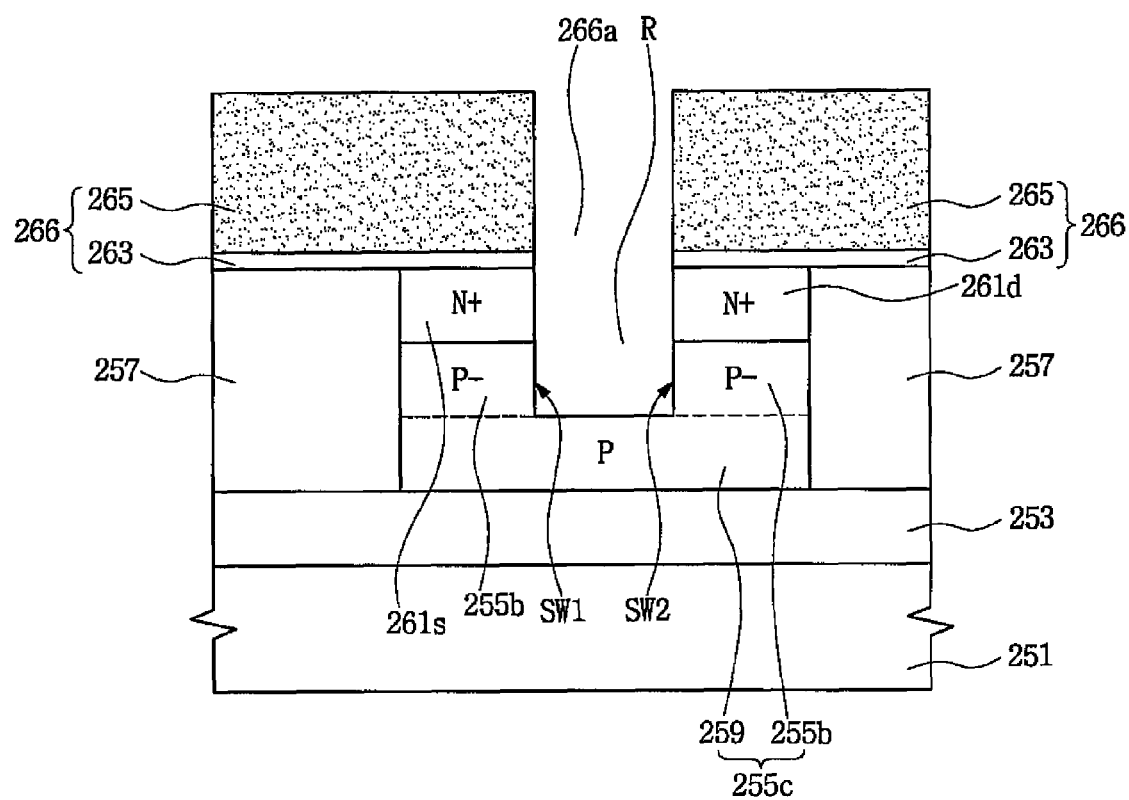

Referring to FIGS. 4 and 19, a mask pattern 266 is formed on the substrate having the active semiconductor pattern 255a. The mask pattern 266 may be formed to define an opening 266a over the active semiconductor pattern 255a. The mask pattern 266 may also include at least two insulating layers. For example, the mask pattern 266 may be formed to include a pad oxide layer pattern 263 and a pad nitride layer pattern 265, which are sequentially stacked.

The active semiconductor pattern 255a is etched using the mask pattern 266 as an etch mask, to form a recessed region R passing through the impurity region 261. Accordingly, a recessed channel region is formed along a bottom surface and sidewalls of the recessed region R. The recessed region R may be formed deeper than the thickness of the impurity region 261, and shallower than the total thickness of the active semiconductor pattern 255a. As a result, the recessed region R divides the impurity region 261 into a source region 261s and a drain region 261d, which are spaced apart or separated from each other. The recessed region R may include a first sidewall SW1 adjacent to the source region 261s, and a second sidewall SW2 adjacent to the drain region 261d.

Figure 20:
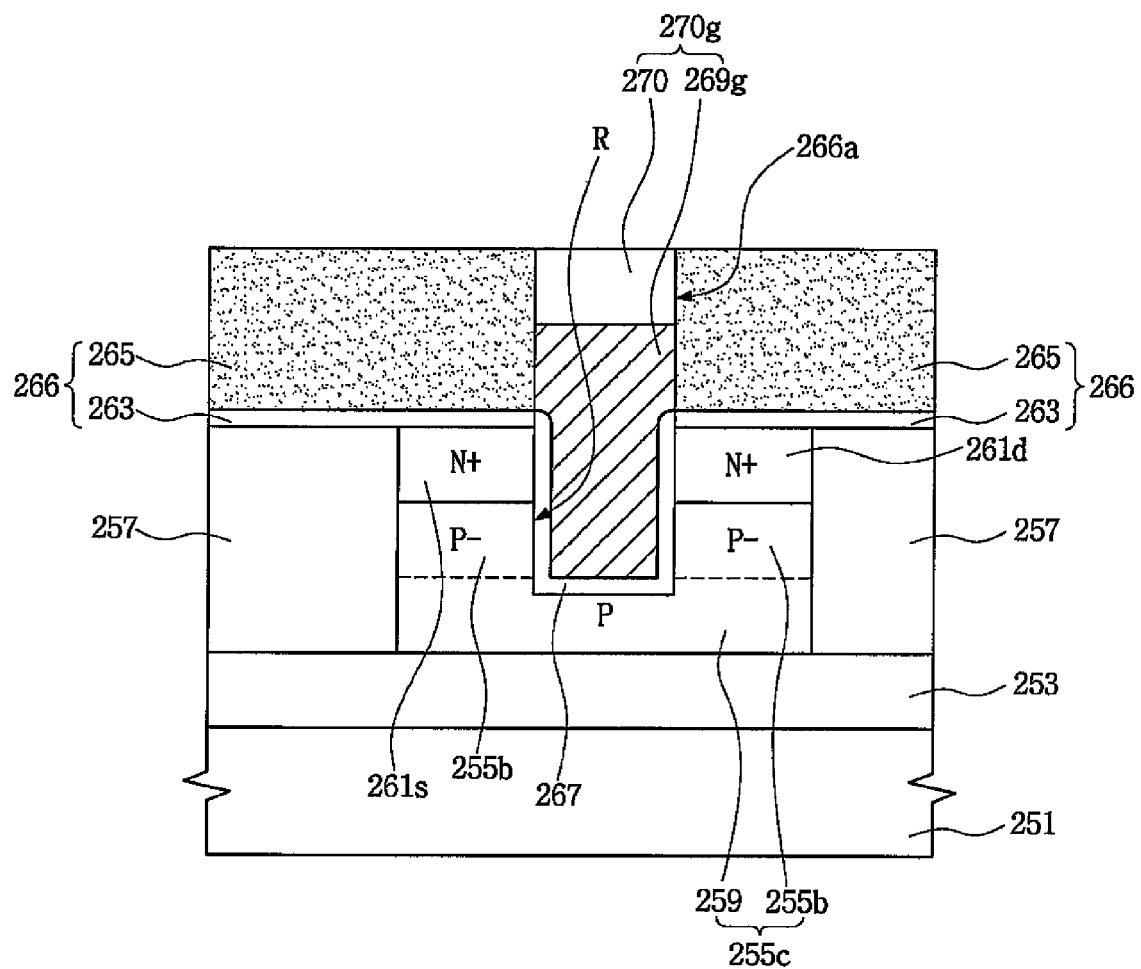

Referring to FIGS. 4 and 20, a gate insulating layer 267 is formed on an inner wall of the recessed region R. The gate insulating layer 267 may be a thermal oxide layer, for example. A gate conductive layer filling the recessed region R and the opening 266a is formed on the substrate having the gate insulating layer 267 and then planarized to expose a top surface of the mask pattern 266. As a result, a gate conductive layer pattern is formed in the recessed region R and the opening 266a. The gate conductive layer pattern may be further etched to form a recessed gate electrode 269g. The gate conductive layer may be formed from a doped polysilicon layer, for example.

A gate capping insulating layer is formed on the substrate having the recessed gate electrode 269g and then planarized to expose a top surface of the mask pattern 266. As a result, a capping insulating layer pattern 270 may be formed in the opening 266a above the recessed gate electrode 269g. The gate capping insulating layer may be formed from a material having etch selectivity with respect to the mask pattern 266, for example, a silicon oxide layer. The gate electrode 269g and the capping insulating layer pattern 270 constitute a gate pattern 270g.

Figure 21:
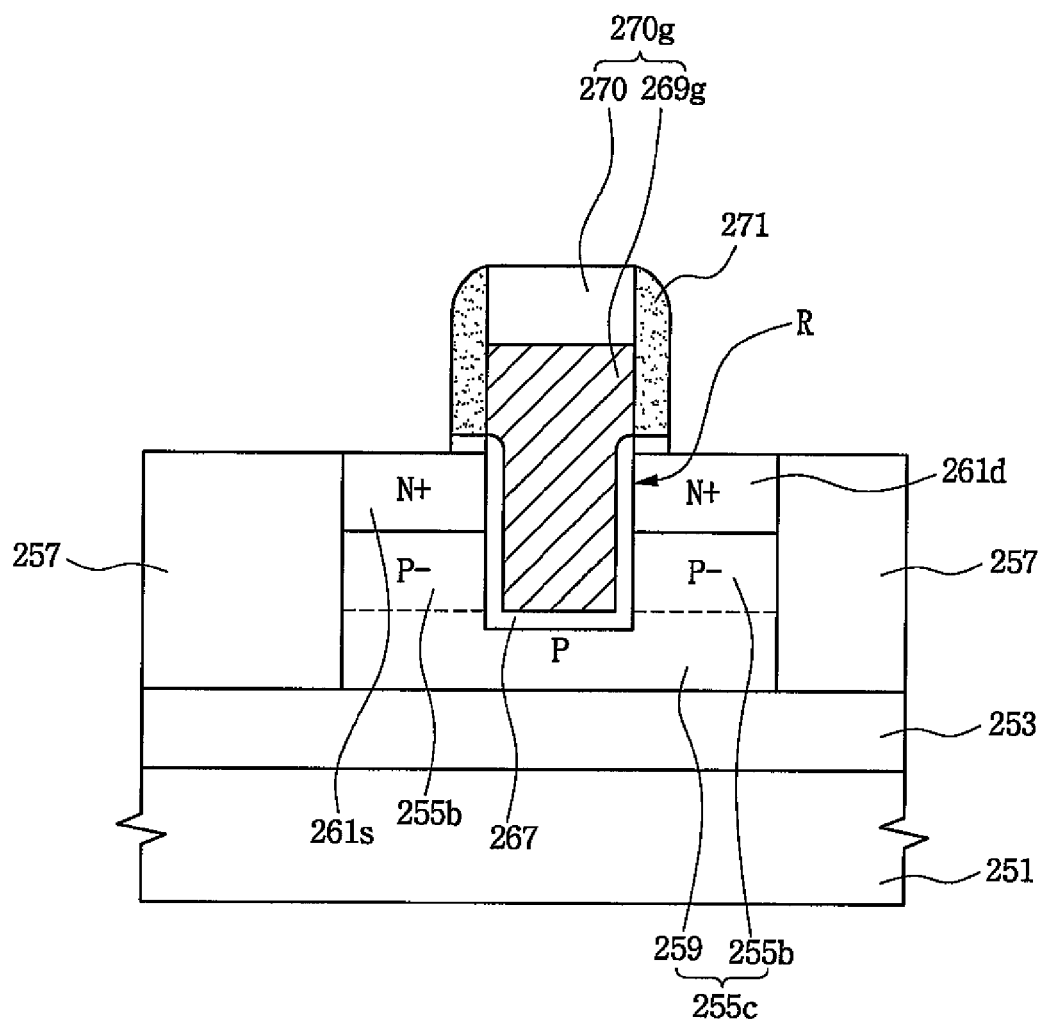

Referring to FIGS. 4 and 21, at least a portion of the mask pattern 266, e.g., the pad nitride layer pattern 265, may be removed, thereby exposing upper sidewalls of the gate pattern 270g. As a result, an upper region of the gate pattern 270g may project above the isolation layer 257. Spacers 271 may be formed on sidewalls of the projecting portion of the gate pattern 270g. The spacers 271 may be formed of an insulating layer having an etch selectivity with respect to the capping insulating layer pattern 270. For example, the spacers 271 may be formed from a silicon nitride layer. During the formation of the spacers 271, the pad oxide layer 263 (FIG. 20) on the source and drain regions 261s and 261d may be over-etched. In this case, the source and drain regions 261s and 261d may be exposed.

Figure 22:
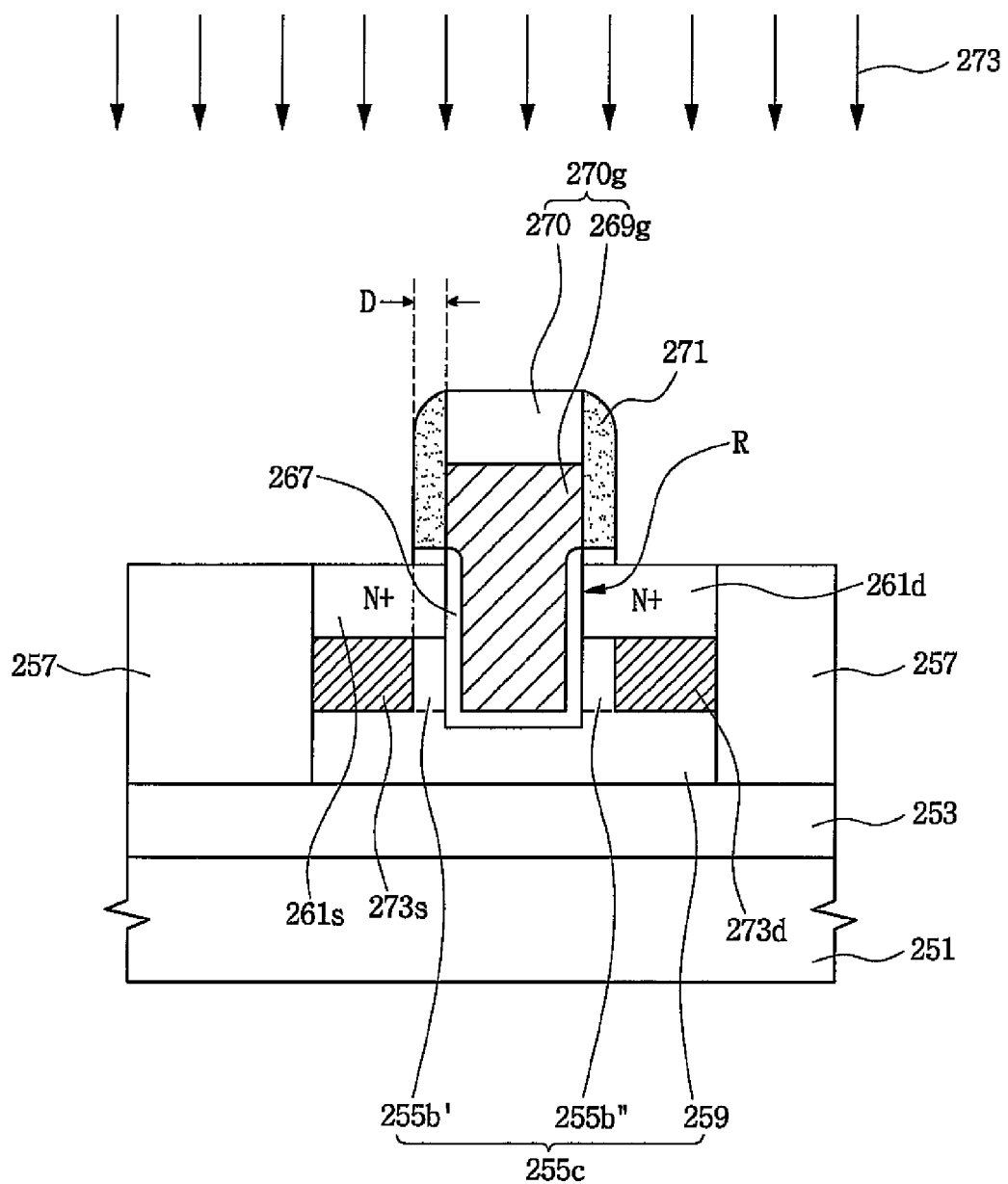

Referring to FIGS. 4 and 22, sacrificial impurity ions 273 are injected into the bulk region 255c using the gate pattern 270g and the spacers 271 as ion injection masks, forming first and second sacrificial impurity layers 273s and 273d beneath the source and drain regions 261s and 261d, respectively. A top surface of the first sacrificial impurity layer 273s is formed to contact a bottom surface of the source region 261s, and a top surface of the second sacrificial impurity layer 273d is formed to contact a bottom surface of the drain region 261d. As a result, a first bulk region 255b' is defined between the first sacrificial impurity layer 273s and the recessed region R, and a second bulk region 255b" is defined between the second sacrificial impurity layer 273d and the recessed region R. In the embodiment, the first and second bulk regions 255b' and 255b" may have the same width D as the spacers 271 because they are self-aligned with the spacers 271. The sacrificial impurity ions may be silicon germanium ions, for example. In this case, the first and second sacrificial impurity layers 273s and 273d may be formed from silicon germanium layers.

In alternative embodiments, the first and second sacrificial impurity layers 273s and 273d may be the same or different from the upper bulk region 255b (FIG. 21) in thickness. For example, the first and second sacrificial impurity layers 273s and 273d, as illustrated in FIG. 22 are depicted as having the same thickness as the upper bulk region 255b. Also, the recessed region R may be formed to have the same depth as the total thickness of the source and drain regions 261s and 261d and the upper bulk region 255b. In this case, the first and second bulk regions 255b' and 255b" may be the upper bulk region 255b remaining under the spacers 271, and the bulk region 255c may include the first and second bulk regions 255b' and 255b" and the lower bulk region 259. However, in alternative embodiments of the present invention, the thicknesses of the first and second sacrificial impurity layers 273s and 273d and the depth of the recessed region R may vary, without departing for the spirit and scope of the present invention. For example, the first and second sacrificial impurity layers 273s and 273d may be formed thinner or thicker than the upper bulk region 255b, and the recessed region R may be formed to have a bottom surface higher or lower than the juncture between the lower bulk region 259 and the upper bulk region 255b.

Figure 23:
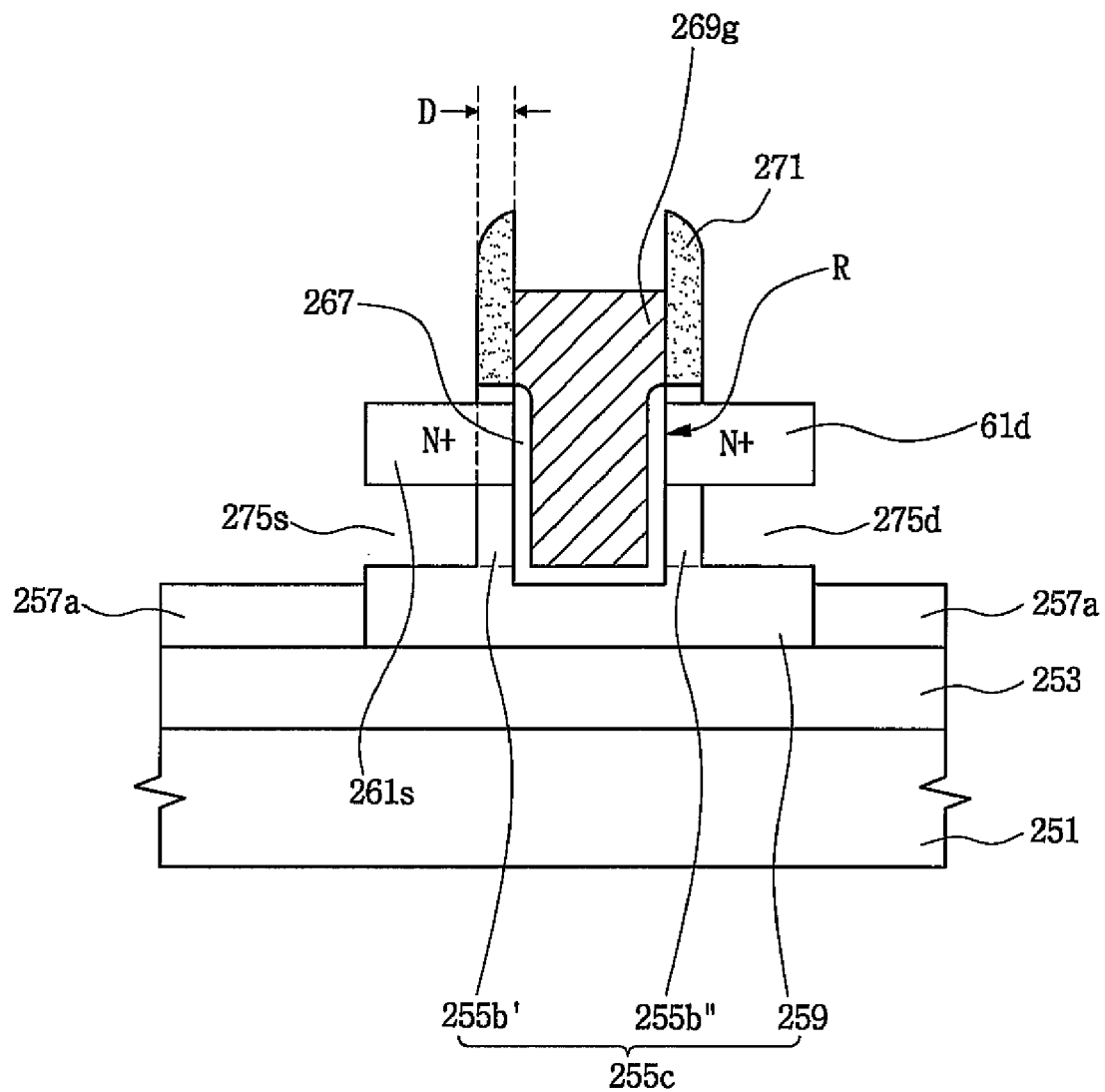

Referring to FIGS. 4 and 23, the isolation layer 257 (FIG. 22) is etched to expose the first and second sacrificial impurity layers 273s and 273d When the capping insulating layer pattern 270 (FIG. 22) is formed of the same material layer as the isolation layer 257 (for example, a silicon oxide layer), the capping insulating layer pattern 270 may be removed during the etching of the isolation layer 257. Then, the exposed sacrificial impurity layers 273s and 273d are likewise selectively removed. As a result, a first undercut region 275s may be formed under the source region 261s, and a second undercut region 275d may be formed under the drain region 261d.

Figure 24:
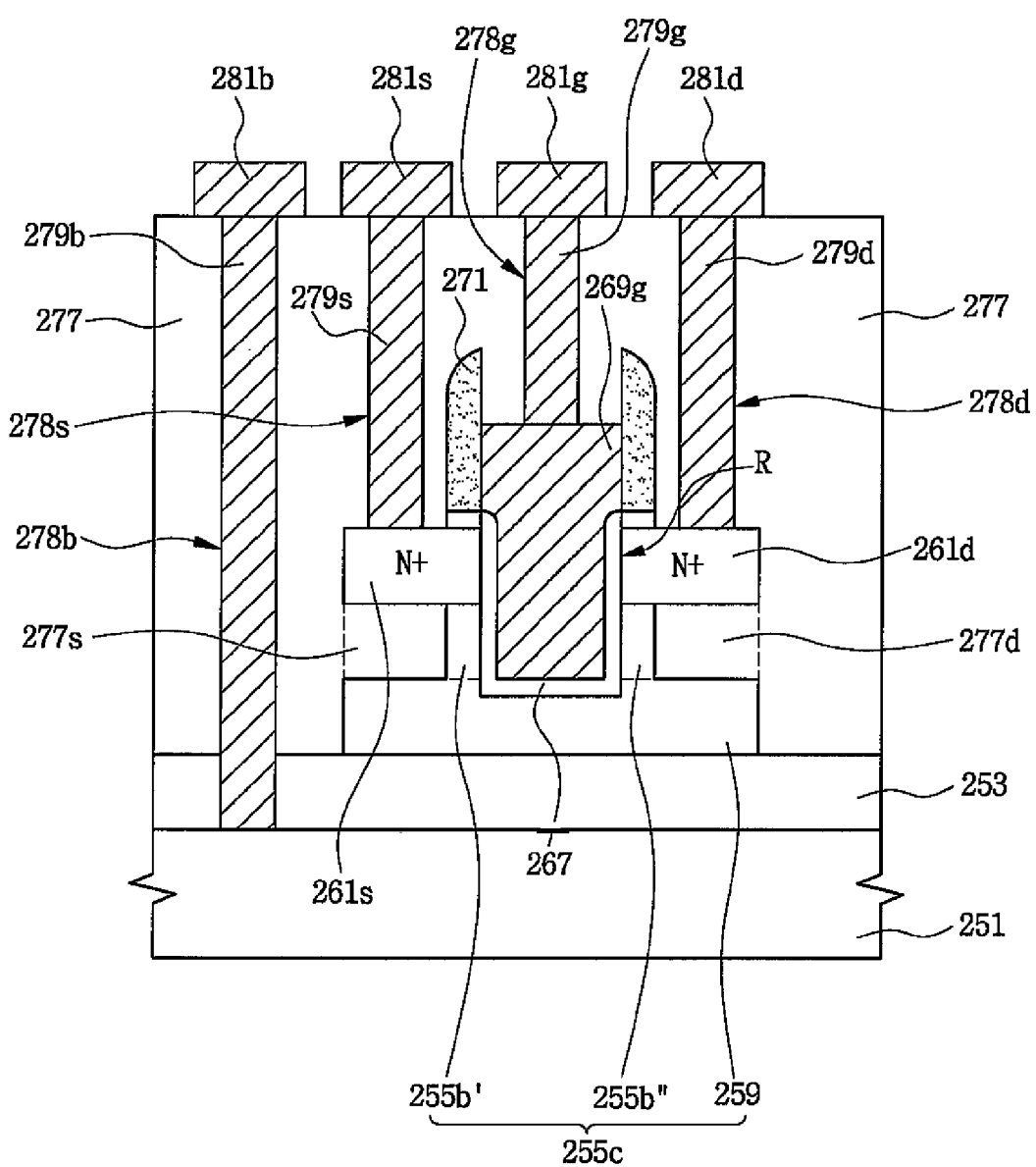

Referring to FIGS. 4 and 24, an insulating layer 277 is formed on the substrate having the undercut regions 275s and 275d. In the process, the insulating layer 277 fills the undercut regions 275s and 275d to define first and second insulating regions 277s and 277d under the source and drain regions 261s and 261d, respectively. In other words, the first insulating region 277s may be a first insulating layer pattern 277s in the first undercut region 275s, and the second insulating region 277d may be a second insulating layer pattern 277d in the second undercut region 275d. Alternatively, the insulating layer 277 may be formed to leave empty spaces in the undercut regions 275s and 275d, respectively. In this case, the first insulating region 277s may be a first empty space in the first undercut region 275s, and the second insulating region 277d may be a second empty space in the second undercut region 275d.

Subsequently, the insulating layer 277 and the buried insulating layer 253 may be patterned to form a back gate contact hole 278b, a source contact hole 278s, a gate contact hole 278g and a drain contact hole 278d, which respectively expose the supporting substrate 251, the source region 261s, the gate electrode 269g and the drain region 261. A back gate contact plug 279b, a source contact plug 279s, a gate contact plug 279g and a drain contact plug 279d may be formed in the contact holes 278b, 278s, 278g and 278d, respectively A conductive layer, such as a metal layer, is formed on the substrate having the contact plugs 279b, 279s, 279g and 279d. The conductive layer is patterned to form a back gate interconnection 281b, a source interconnection 281s, a gate interconnection 281g and a drain interconnection 281d, which are electrically connected to the contact plugs 279b, 279s, 279g and 279d, respectively.

According to the embodiments described above, leakage shielding patterns are located under source and drain regions. The leakage shielding patterns may be arranged at outer sides of a gate electrode. A floating body may be located between the source and drain regions facing each other, and extend beneath the leakage shielding patterns. An excess carrier storage region may be located in the floating body.

Accordingly, a contact surface of the source and drain regions and the floating body is minimized by the leakage shielding patterns. The leakage shielding patterns block a leakage path of the excess holes accumulated in the excess carrier storage region. Therefore, the retention time of the excess holes accumulated in the excess carrier storage region is significantly extended, as compared to the conventional art.

Furthermore, insulating regions are located under source and drain regions on sides of a recessed channel region Accordingly, a junction area of the source and drain regions significantly decreases, thus improving retention characteristics (e.g., of data "1") of excess electric charges (e.g., excess holes) stored in a bulk region under the recessed channel region. Also, first and second bulk regions having fine widths between the insulating regions and the recessed channel region may be provided. Thus, when a certain voltage is applied to a gate electrode located in the recessed region, the first and second bulk regions may be fully or partially depleted. As a result, band-to-band tunneling is significantly suppressed at a junction between the source and drain regions, thus improving the retention characteristics (e.g., of data "0"). Also, the first and second bulk regions may be aligned with spacers formed on sidewalls of the gate electrode.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A single transistor memory cell, comprising:
a buried insulating layer on a semiconductor substrate;
an active semiconductor pattern comprising a bulk region and an impurity region, stacked in sequence on the buried insulating layer;
a recessed region passing through the impurity region, dividing the impurity region into a source region and a drain region, which are separated from each other, the recessed region comprising first and second sidewalls adjacent to the source and drain regions, respectively;
a first insulating region positioned between the source region and the bulk region, and separated from the first sidewall of the recessed region;
a second insulating region positioned between the drain region and the bulk region, and separated from the second sidewall of the recessed region;
a gate electrode positioned within the recessed region, the gate electrode comprising a projecting portion that extends above an upper surface of the impurity region;
a spacer covering sidewalls of the projecting portion of the gate electrode, the first and second insulating regions being self-aligned with an outside of the spacer and the gate electrode; and
an upper insulating layer covering the active semiconductor pattern and the gate electrode, wherein the upper insulating layer is in direct contact with the buried insulating layer, the first insulating region and the second insulating region,
wherein a bottom of the recessed region is disposed lower than the first and second insulating regions.

2. The memory cell according to claim 1, wherein a conductivity type of the impurity region is different than a conductivity type of the bulk region.

3. The memory cell according to claim 1, wherein each of the first insulating region and the second insulating region comprises one of an empty space or an insulating layer pattern.

4. The memory cell according to claim 1, wherein the bulk region comprises a lower bulk region and an upper bulk region, the lower bulk region having a higher impurity concentration than the upper bulk region.

5. The memory cell according to claim 1, wherein the bulk region comprises a first bulk region extending between the first insulating region and the first sidewall, a second bulk region extending between the second insulating region and the second sidewall, and a base bulk region beneath the first insulating region and the second insulating region, and
wherein a portion of the base bulk region is disposed between the first insulating region and the buried insulating region, the portion of the base bulk region is in contact with the first insulating region, the upper insulating layer and the buried insulating layer, and a sidewall of the base bulk region is completely covered by the upper insulating layer.

6. The memory cell according to claim 5, wherein the first bulk region and the second bulk region are aligned with the spacer.

7. The memory cell according to claim 6, wherein each of the first bulk region and the second bulk region has a same width as the spacer.

8. The memory cell according to claim 5, wherein top surfaces of the first and second bulk regions are disposed lower than the source region and the drain region.

9. The memory cell according to claim 1, further comprising:
a gate insulating layer positioned between the gate electrode and the first and second sidewalls of the recessed region.

10. The memory cell according to claim 1, further comprising:
a back gate interconnection located on the upper insulating layer, and electrically connected to the semiconductor substrate through a back gate contact hole passing through the upper insulating layer and the buried insulating layer.

11. The memory cell according to claim 1, wherein the bulk region includes an excess carrier storage region.

12. The memory cell according to claim 1, wherein the bottom of the recessed region is disposed lower than bottom surfaces of the first and second insulating regions.

13. A single transistor memory cell, comprising:
a buried insulating layer on a semiconductor substrate;
an active semiconductor pattern comprising a bulk region and an impurity region, stacked in sequence on the buried insulating layer;
a recessed region passing through the impurity region, dividing the impurity region into a source region and a drain region, which are separated from each other;
a gate electrode positioned within the recessed region, the gate electrode comprising a projecting portion that extends above an upper surface of the impurity region;
a first insulating region positioned between the source region and the bulk region;
a second insulating region positioned between the drain region and the bulk region;
a spacer covering sidewalls of the projecting portion of the gate electrode, wherein the first and second insulating regions are self-aligned with outside of the spacer and the gate electrode; and
an upper insulating layer covering the active semiconductor pattern and the gate electrode, wherein the upper insulating layer is in direct contact with the buried insulating layer, the first insulating region and the second insulating region,
wherein a bottom of the gate electrode is disposed lower than tops of the first and second insulating regions,
wherein the bulk region comprises a first bulk region extending between the first insulating region and the gate electrode, a second bulk region extending between the second insulation region and the gate electrode, and a base bulk region beneath the first insulating region and the second insulating region, and
wherein the base bulk region is in contact with the upper insulating layer and the buried insulating layer.

14. The memory cell according to claim 13, wherein a bottom of the recessed region is disposed lower than bottoms of the first and second insulating regions.

15. The memory cell according to claim 13, wherein a portion of the base bulk region is disposed between the first insulating region and the buried insulating layer, the portion of the base bulk region being in contact with the first insulating region, the upper insulating layer and the buried insulating layer, and a sidewall of the base bulk region is completely covered by the upper insulating layer.

16. The memory cell according to claim 13, wherein tops of the first and second bulk regions are disposed lower than the source region and the drain region.

* * * * *